(12) United States Patent
Koyama et al.

(10) Patent No.: US 11,860,193 B2
(45) Date of Patent: Jan. 2, 2024

(54) ANISOTROPIC CONDUCTIVE SHEET, ANISOTROPIC CONDUCTIVE COMPOSITE SHEET, ANISOTROPIC CONDUCTIVE SHEET SET, ELECTRIC INSPECTION DEVICE AND ELECTRIC INSPECTION METHOD

(71) Applicant: Mitsui Chemicals, Inc., Tokyo (JP)

(72) Inventors: Taichi Koyama, Yokohama (JP); Katsunori Nishiura, Chiba (JP); Daisuke Yamada, Yokohama (JP); Yoichi Kodama, Kawasaki (JP)

(73) Assignee: Mitsui Chemicals, Inc., Tokyo (JP)

( * ) Notice: Subject to any disclaimer, the term of this patent is extended or adjusted under 35 U.S.C. 154(b) by 180 days.

(21) Appl. No.: 17/295,474

(22) PCT Filed: Nov. 21, 2019

(86) PCT No.: PCT/JP2019/045532
§ 371 (c)(1),
(2) Date: May 20, 2021

(87) PCT Pub. No.: WO2020/105693
PCT Pub. Date: May 28, 2020

(65) Prior Publication Data
US 2022/0187338 A1 Jun. 16, 2022

(30) Foreign Application Priority Data

Nov. 21, 2018 (JP) .................. 2018-218281
Mar. 22, 2019 (JP) .................. 2019-054538
May 27, 2019 (JP) .................. 2019-098814

(51) Int. Cl.
*G01R 1/073* (2006.01)

(52) U.S. Cl.
CPC .................. *G01R 1/07314* (2013.01)

(58) Field of Classification Search
CPC .................................. G01R 1/07314
See application file for complete search history.

(56) References Cited

U.S. PATENT DOCUMENTS 6,927,343 B2  8/2005  Watanabe
7,922,497 B2  4/2011  Yamada
(Continued)

FOREIGN PATENT DOCUMENTS

CN   1431518 A       7/2003
JP   56002162 A  *  1/1981
(Continued)

OTHER PUBLICATIONS

English translation of JP-56002162-A (Year: 1981).*
(Continued)

*Primary Examiner* — Paresh Patel
(74) *Attorney, Agent, or Firm* — Shih IP Law Group, PLLC.

(57) ABSTRACT

This anisotropic conductive sheet includes: a plurality of conductive paths; and an insulation layer which is disposed to fill the space between the plurality of conductive paths and has a first surface and a second surface. Each of the conductive path extends in a thickness direction of the insulation layer and has a first end part on the first surface side and a second end part on the second surface side. When the conductive paths are seen through so that the center of the first end part overlaps the center of the second end part, at least a portion of the conductive paths does not overlap the first end part and the second end part.

18 Claims, 17 Drawing Sheets

(56) References Cited

U.S. PATENT DOCUMENTS

| | | |
|---|---|---|
| 2003/0127246 A1 | 7/2003 | Watanabe |
| 2005/0215086 A1 | 9/2005 | Sato |
| 2013/0249585 A1 | 9/2013 | Kinita |

FOREIGN PATENT DOCUMENTS

| | | | | |
|---|---|---|---|---|
| JP | 04017282 A | 1/1992 | | |
| JP | H11-211754 A | 8/1999 | | |
| JP | 2000180506 A | * 6/2000 | ......... | G01R 1/07314 |
| JP | 2004172588 A | 6/2004 | | |
| JP | 2008234948 A | 10/2008 | | |
| JP | 2012-132685 A | 7/2012 | | |
| JP | 2016213186 A | 12/2016 | | |
| KR | 10-2008-0059260 A | 6/2008 | | |

OTHER PUBLICATIONS

English translation of JP-2000180506-A (Year: 2000).*
International Search Report from International Application No. PCT/JP2019/045532 dated Jan. 7, 2020.

* cited by examiner

ANISOTROPIC CONDUCTIVE SHEET, ANISOTROPIC CONDUCTIVE COMPOSITE SHEET, ANISOTROPIC CONDUCTIVE SHEET SET, ELECTRIC INSPECTION DEVICE AND ELECTRIC INSPECTION METHOD

TECHNICAL FIELD

The present disclosure relates to an anisotropic conductive sheet, an anisotropic conductive composite sheet, an anisotropic conductive sheet set, an electrical testing apparatus and an electrical testing method.

BACKGROUND ART

An anisotropic conductive sheet that has conductivity in the thickness direction and insulation in the surface direction is known. Such an anisotropic conductive sheet is used for various applications, such as a probe (contact) of an electrical testing apparatus for measuring the electrical characteristics between measurement points of an inspection object such as a printed board.

As an anisotropic conductive sheet used for electrical testing, an anisotropic conductive sheet including an insulation layer and a plurality of metal pins disposed to extend through the thickness direction thereof, for example, is known (e.g., PTLS 1 and 2). The metal pin is linearly formed along the thickness direction of the insulation layer.

CITATION LIST

Patent Literature

PTL 1
Japanese Patent Application Laid-Open No. H4-17282
PTL 2
Japanese Patent Application Laid-Open No. 2016-213186

SUMMARY OF INVENTION

Technical Problem

However, metal pins are exposed at the surfaces of the anisotropic conductive sheets disclosed in PTLS 1 and 2. Therefore, when aligning the terminal of a semiconductor package as an inspection object on such anisotropic conductive sheets, and when pressing a semiconductor package thereon for the purpose of electrical connection, the terminal of the semiconductor package is easily damaged by making contact with the metal pin exposed from the surface of the anisotropic conductive sheet.

To solve the above-mentioned problems, an object of the present disclosure is to provide an anisotropic conductive sheet, an anisotropic conductive composite sheet, an anisotropic conductive sheet set, an electrical testing apparatus and an electrical testing method that can suppress the damage of the terminal of the inspection object.

Solution to Problem

The above-mentioned problems are solved by the following configurations.

An anisotropic conductive sheet of the present disclosure includes: a plurality of conduction paths; and an insulation layer disposed to fill a gap between the plurality of conduction paths, the insulation layer including a first surface and a second surface. Each of the plurality of conduction paths extends in a thickness direction of the insulation layer, and includes a first end portion on a first surface side and a second end portion on a second surface side. When each of the plurality of conduction paths is viewed through such that a center of the first end portion and a center of the second end portion overlap each other, at least a part of each of the plurality of conduction paths does not overlap the first end portion and the second end portion.

An anisotropic conductive composite sheet of the present disclosure includes: a first anisotropic conductive sheet including a plurality of first conduction paths extending through the first anisotropic conductive sheet in a thickness direction of the first anisotropic conductive sheet, and a first insulation layer disposed to fill a gap between the plurality of first conduction paths, the first insulation layer including a third surface and a fourth surface; and a second anisotropic conductive sheet including a plurality of second conduction paths extended in a thickness direction of the second anisotropic conductive sheet, and a second insulation layer disposed to fill a gap between the plurality of second conduction paths, the second insulation layer including a fifth surface and a sixth surface. The first anisotropic conductive sheet and the second anisotropic conductive sheet are stacked such that the third surface of the first insulation layer and the sixth surface of the second insulation layer face each other. At least one of the first anisotropic conductive sheet and the second anisotropic conductive sheet is the anisotropic conductive sheet. A center-to-center distance p2 of the plurality of second conduction paths on a fifth surface side is smaller than a center-to-center distance p1 of the plurality of first conduction paths on a third surface side. A rockwell hardness of the fifth surface of the second anisotropic conductive sheet is smaller than a rockwell hardness of the third surface of the first anisotropic conductive sheet.

An anisotropic conductive sheet set of the present disclosure includes: a first anisotropic conductive sheet including a plurality of first conduction paths extending through the first anisotropic conductive sheet in a thickness direction of the first anisotropic conductive sheet, and a first insulation layer disposed to fill a gap between the plurality of first conduction paths, the first insulation layer including a third surface and a fourth surface; and a second anisotropic conductive sheet including a plurality of second conduction paths extended in a thickness direction of the second anisotropic conductive sheet, and a second insulation layer disposed to fill a gap between the plurality of second conduction paths, the second insulation layer including a fifth surface and a sixth surface. The first anisotropic conductive sheet and the second anisotropic conductive sheet are configured to be stacked such that the third surface of the first insulation layer and the sixth surface of the second insulation layer face each other. At least one of the first anisotropic conductive sheet and the second anisotropic conductive sheet is the anisotropic conductive sheet. A center-to-center distance p2 of the plurality of second conduction paths on a fifth surface side is smaller than a center-to-center distance p1 of the plurality of first conduction paths on a third surface side. A rockwell hardness of the fifth surface of the second anisotropic conductive sheet is smaller than a rockwell hardness of the third surface of the first anisotropic conductive sheet.

An electrical testing apparatus of the present disclosure includes: an inspection substrate including a plurality of electrodes; and the anisotropic conductive sheet, the anisotropic conductive composite sheet, or a laminate of the anisotropic conductive sheet set, the anisotropic conductive sheet, the anisotropic conductive composite sheet, or the laminate of the anisotropic conductive sheet set being disposed on a surface of the inspection substrate on which the plurality of electrodes is disposed.

An electrical testing method of the present disclosure includes: stacking an inspection substrate including a plurality of electrodes and an inspection object including a terminal through the anisotropic conductive sheet, the anisotropic conductive composite sheet, or a laminate of the anisotropic conductive sheet set, and electrically connecting the plurality of electrodes of the inspection substrate and the terminal of the inspection object through the anisotropic conductive sheet.

Advantageous Effects of Invention

The present disclosure can provide an anisotropic conductive sheet, an anisotropic conductive composite sheet, an anisotropic conductive sheet set, an electrical testing apparatus and an electrical testing method that can suppress the damage of the terminal of the inspection object.

DESCRIPTION OF EMBODIMENTS

Embodiments of the present disclosure are elaborated below with reference to the accompanying drawings.

1. Embodiment 1

Anisotropic Conductive Sheet

Figure 1A:
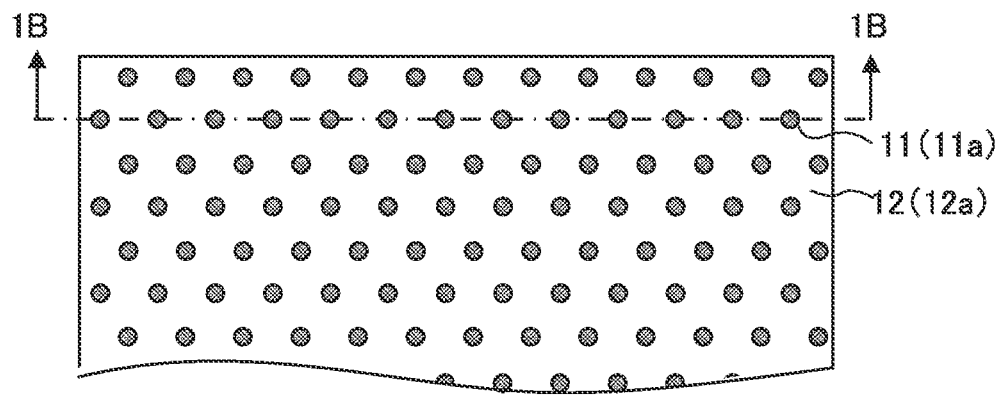
FIG. 1A is a plan view illustrating an anisotropic conductive sheet according to Embodiment 1.
Figure 1B:
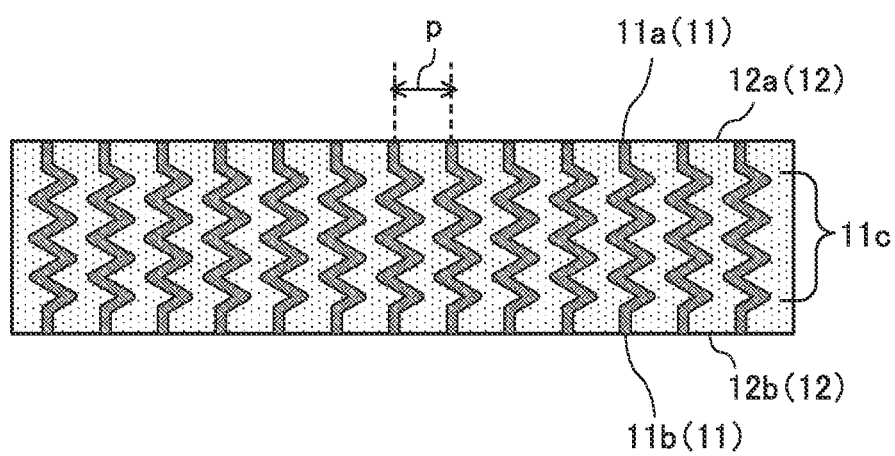
FIG. 1B is a sectional view taken along line 1B-1B of FIG. 1A.
Figure 2A:
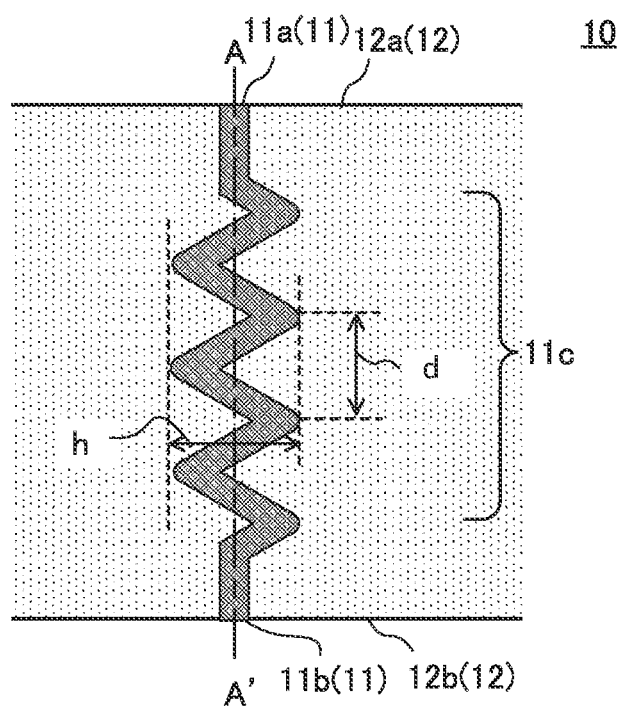
FIG. 2A is an enlarged view of FIG. 1B.
Figure 2B:
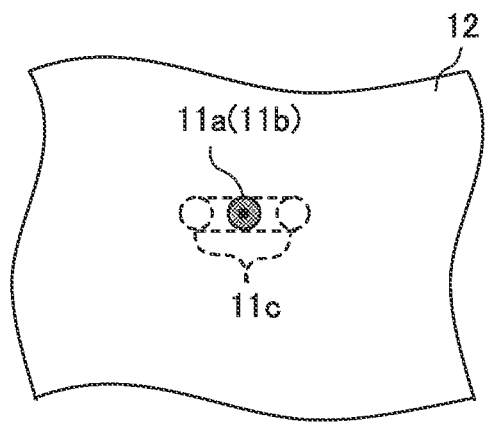
FIG. 2B is a perspective view of an anisotropic conductive sheet as viewed through it in plan from a first surface side in FIG. 2A.

FIG. 1A is a plan view illustrating anisotropic conductive sheet 10 according to Embodiment 1, and FIG. 1B is a sectional view taken along line 1B-1B of FIG. 1A. FIG. 2A is an enlarged view of FIG. 1B, and FIG. 2B is a perspective view of anisotropic conductive sheet 10 as viewed through it in plan from first surface 12a side in FIG. 2A.

As illustrated in FIGS. 1A and 1B, anisotropic conductive sheet 10 includes a plurality of conduction paths 11, and insulation layer 12 disposed to fill the gap therebetween and including first surface 12a and second surface 12b (see FIG. 1B). In the present embodiment, preferably, an inspection object is disposed at first surface 12a.

Conduction Path 11

Conduction path 11 extends in the thickness direction of insulation layer 12, and includes first end portion 11a on the first surface 12a side and second end portion 11b on the second surface side 12b (see FIG. 1B). To be more specific, preferably, conduction path 11 extends through insulation layer 12 in the thickness direction, with first end portion 11a exposed to first surface 12a side and second end portion 11b exposed to second surface 12b side.

To be more specific, the configuration in which conduction path 11 extends in the thickness direction of insulation layer 12 means that the direction connecting first end portion 11a and second end portion 11b of conduction path 11 is approximately parallel to the thickness direction of insulation layer 12. The "approximately parallel" means that the angle to the thickness direction of insulation layer 12 is ±10° or smaller.

In the case where first end portion 11a of conduction path 11 is exposed to first surface 12a side of insulation layer 12, first end portion 11a of conduction path 11 may be flush with first surface 12a of insulation layer 12, or may be protruded from first surface 12a of insulation layer 12. Likewise, in the case where second end portion 11b of conduction path 11 is exposed to second surface 12b side of insulation layer 12, second end portion 11b of conduction path 11 may be flush with second surface 12b of insulation layer 12, or may be protruded from second surface 12b of insulation layer 12.

Center-to-center distance (pitch) p of first end portions 11a of the plurality of conduction paths 11 is not limited, and may be appropriately set in accordance with the pitch of the terminal of the inspection object (see FIG. 1B). The pitch of the terminal of a high bandwidth memory (HBM) as an inspection object is 55 μm, and the pitch of the terminal of a package on package (PoP) is 400 to 650 μm, and accordingly, center-to-center distance p of the plurality of conduction paths 11 may be 5 to 650 μm, for example. Or more preferably, center-to-center distance p of the plurality of conduction paths 11 is 5 to 55 μm from the viewpoint of eliminating the need for alignment (alignment free) of the terminal of the inspection object. Center-to-center distance p of the plurality of conduction paths 11 is the smallest center-to-center distance of the center-to-center distances of first end portions 11a of the plurality of conduction paths 11. The center of first end portion 11a of conduction path 11 is the center of gravity of first end portion 11a.

Center-to-center distance p of first end portions 11a of the plurality of conduction paths 11 and the center-to-center distance of second end portion 11b may be the same or different from each other. In the present embodiment, center-to-center distance p of first end portions 11a of the plurality of conduction paths 11 and the center-to-center distance of second end portion 11b are the same, and are also referred to as a center-to-center distance of the plurality of conduction paths 11.

It suffices that the circle equivalent diameter of first end portion 11a of conduction path 11 is a value with which center-to-center distance p of first end portions 11a of the plurality of conduction paths 11 can be adjusted to the above-mentioned range, and the continuity with the terminal of the inspection object can be ensured. To be more specific, preferably, the circle equivalent diameter of first end portion 11a of conduction path 11 is 2 to 20 μm, for example. The circle equivalent diameter of first end portion 11a of conduction path 11 means the circle equivalent diameter of first end portion 11a of conduction path 11 as viewed along the thickness direction of insulation layer 12.

The circle equivalent diameters of first end portion 11a and second end portion 11b of conduction path 11 may be the same or different from each other. In the present embodiment, the circle equivalent diameters of first end portion 11a and second end portion 11b of conduction path 11 are the same, and they are also referred to as the circle equivalent diameter of conduction path 11.

When anisotropic conductive sheet 10 is viewed through it in such a manner that the center of first end portion 11a and the center of second end portion 11b overlap each other, at least a part between first end portion 11a and second end portion 11b in conduction path 11 (that is, at least a part of conduction path 11 inside anisotropic conductive sheet 10) is disposed in such a manner as not to overlap first end portion 11a and second end portion 11b (see FIGS. 2A and 2B). The configuration in which at least a part of conduction path 11 does not overlap first end portion 11a and second end portion 11b as viewed through it in the above-mentioned manner means that at least a part of conduction path 11 is away from first end portion 11a and second end portion 11b as viewed through it in the above-mentioned manner (see FIG. 2B).

To be more specific, when anisotropic conductive sheet 10 is viewed along virtual straight line A-A' connecting the center of first end portion 11a and the center of second end portion 11b (see FIG. 2A), at least a part between first end portion 11a and second end portion 11b in conduction path 11 is not located on virtual straight line A-A', and is located outside virtual straight line A-A' (the dotted line of FIG. 2B).

That is, in a cross-section along the thickness direction of insulation layer 12, at least a part between first end portion 11a and second end portion 11b in conduction path 11 includes non-linear part 11c (see FIG. 2A).

To be more specific, in a cross-section along the thickness direction of insulation layer 12, non-linear part 11c is a portion (bent portion) where conduction path 11 does not have a straight-line shape. The shape of non-linear part 11c is not limited as long as non-linear part 11c has a spring-like elasticity in the thickness direction of insulation layer 12, and examples of such a shape include a wavy shape, a zigzag shape, and an arch shape. In the present embodiment, non-linear part 11c has a zigzag shape.

Conduction path 11 including non-linear part 11c with such a shape can have a spring-like elasticity in the thickness direction of insulation layer 12. In this manner, the impact of placing the inspection object on the surface of anisotropic conductive sheet 10 and the pressing force from upper side of the inspection object for electrical connection are absorbed and dispersed, and thus the damage of the terminal of the inspection object due to a contact with first end portion 11a of conduction path 11 of anisotropic conductive sheet 10 can be suppressed.

Non-linear part 11c is disposed at least in a part of conduction path 11. Preferably, non-linear part 11c is disposed at least in a part of conduction path 11 located on first end portion 11a side than the midpoint between first end portion 11a and second end portion 11b (that is, it is disposed on first surface 12a side). One reason for this is to facilitate the absorption of the impact of placing the inspection object on the surface of anisotropic conductive sheet 10 so as to suppress the damage of the terminal of the inspection object due to a contact with first end portion 11a of conduction path 11 of anisotropic conductive sheet 10. In the present embodiment, non-linear part 11c is disposed in the entirety of a center portion between first end portion 11a and second end portion 11b in conduction path 11 (see FIGS. 1B and 2A).

Distance d (the distance between peaks adjacent to each other) and height h of the zigzag shape of non-linear part 11c of conduction path 11 in a cross-section along the thickness direction of insulation layer 12 is not limited as long as a spring elasticity that can absorb the impact of placing the inspection object on the surface of anisotropic conductive sheet 10.

For example, distance d of the zigzag shape (the distance between the vertexes of peaks adjacent to each other) of non-linear part 11c of conduction path 11 in a cross-section along the thickness direction of insulation layer 12 may be approximately 5 to 50% of the thickness of insulation layer 12 (see FIG. 2A).

In addition, height h of the zigzag shape of non-linear part 11c of conduction path 11 in a cross-section along the thickness direction of insulation layer 12 may be approximately 2 to 20% of the thickness of insulation layer 12. Height h of the zigzag shape is the distance between the straight line connecting the vertexes of two peaks adjacent to each other, and the straight line connecting the bottom point of the valley formed between the two peaks and the bottom points of two valleys formed on both sides of that valley (see FIG. 2A).

The material of conduction path 11 is not limited as long as the material has conductivity. Preferably, the volume resistivity of the material of conduction path 11 is $1.0 \times 10 \times 10^{-4}$ Ω-cm or smaller, more preferably, $1.0 \times 10 \times 10^{-6}$ to $1.0 \times 10^{-9}$ Ω-cm, for example.

It suffices that the volume resistivity of the material of conduction path 11 satisfies the above-mentioned range, and examples of the material of conduction path 11 include metal materials such as copper, gold, nickel, tin, iron or alloys of them, and carbon materials such as carbon black. Among them, the material of conduction path 11 is preferably a metal material. Specifically, it is preferable that conduction path 11 be a metal line composed of a metal material.

The metal line may be composed of a single layer, or a plurality of layers. For example, the metal line may have a multilayer structure with a copper alloy layer as the core material, a nickel or nickel alloy layer as the intermediate coating material, and a gold layer as the top surface coating material. For example, with an intermediate coating material, internal diffusion of the top surface coating material to the core material can be prevented.

Insulation Layer 12

Insulation layer 12 is disposed to fill the gap between the plurality of conduction paths 11, and insulates the plurality of conduction paths 11 from each other. Such an insulation layer 12 includes first surface 12a as one surface of anisotropic conductive sheet 10, and second surface 12b as the other surface.

Insulation layer 12 may be composed of a first resin composition. Preferably, the glass transition temperature of the first resin composition is −40° C. or below, more preferably −50° C. or below. The glass transition temperature of the first resin composition can be measured by complying with JIS K 7095:2012.

Preferably, the storage modulus of the first resin composition at 25° C. $1.0 \times 10^7$ Pa or smaller, more preferably $1.0 \times 10^5$ to $9.0 \times 10^6$ Pa. In particular, the boundary surface between conduction path 11 and insulation layer 12 is prone to peeling due to repeated pressurization and depressurization, and in such a case, it is particularly effective to provide bonding layer 14. The storage modulus of the first resin composition can be measured by complying with JIS K 7244-1:1998/ISO6721-1:1994.

The glass transition temperature and the storage modulus of the first resin composition are adjusted by the amount of filler added and the type of elastomer contained in the resin composition. In addition, the storage modulus of the first resin composition can also be adjusted by the morphology of the resin composition (e.g., whether it is porous or not).

The first resin composition can be anything that provides insulation, and there are no particular restrictions, but from the viewpoint of making it easier to meet the glass transition temperature or storage modulus described above, it is preferable to be a cross-linked product of a composition containing an elastomer (base polymer) and a cross-linking agent (hereinafter referred to as the "first elastomer composition").

Preferably, examples of elastomer include elastomers such as silicone rubber, urethane rubber (urethane polymer), acrylic rubber (acrylic polymer), ethylene-propylene-diene copolymer (EPDM), chloroprene rubber, styrene-butadiene copolymer, acrylic nitrile-butadiene copolymer, poly butadiene rubber, natural rubber, polyester thermoplastic elastomer, and olefin thermoplastic elastomer. Among them, silicone rubber is preferable.

The cross-linking agent can be selected according to the type of elastomer. Examples of cross-linking agents for silicone rubber include organic peroxides such as benzoyl peroxide, bis-2,4-dichlorobenzoyl peroxide, dicumyl peroxide, and di-t-butyl peroxide. Examples of cross-linking agents for acrylic rubbers (acrylic polymers) include epoxy compounds, melamine compounds, and isocyanate compounds.

The first elastomer composition may also further contain other components such as adhesion-imparting agents, silane coupling agents, and fillers as necessary, for example, from the viewpoint of facilitating adjustment of adhesion and storage modulus to the above ranges.

The first elastomer composition may be porous, for example, from the perspective of facilitating adjustment of the storage modulus to the above range. In other words, porous silicone can be used.

Thickness

The thickness of insulation layer 12 may be, but not limited as long as it can ensure insulation, 20 to 100 μm, for example. The thickness of insulation layer 12 can be measured by complying with ASTM D6988.

Other Layers

Anisotropic conductive sheet 10 according to the present embodiment may further include layers other than the above-mentioned layers as necessary. For example, it is possible to further include electrolyte layer 13 (see FIG. 8 described later) disposed on the surface of first surface 12a side (or on first end portion 11a of conduction path 11) of anisotropic conductive sheet 10, and/or a plurality of bonding layers 14 (see FIGS. 9A and 9B described later) disposed between the plurality of conduction paths 11 and insulation layer 12.

Operations

Figure 3A:
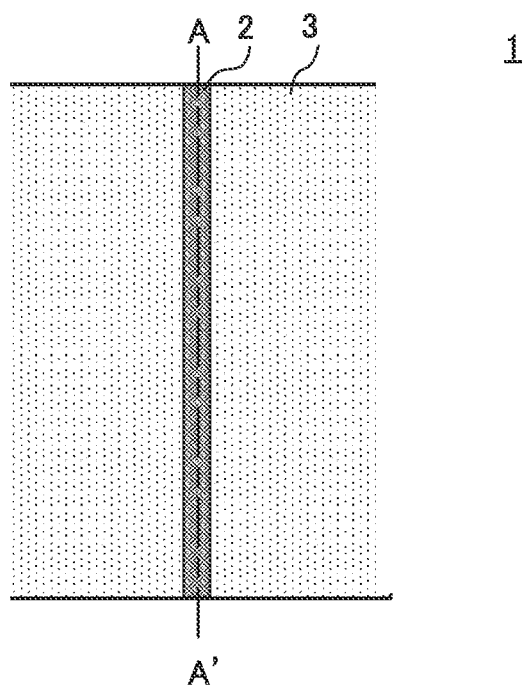
FIG. 3A is an enlarged sectional view of an anisotropic conductive sheet for comparison.

Operations of anisotropic conductive sheet 10 according to the present embodiment are described through comparison with anisotropic conductive sheet 1 for comparison. FIG. 3A is a partially enlarged sectional view of anisotropic conductive sheet 1 for comparison, and FIG. 3B is a plan view of FIG. 3A.

Figure 3B:
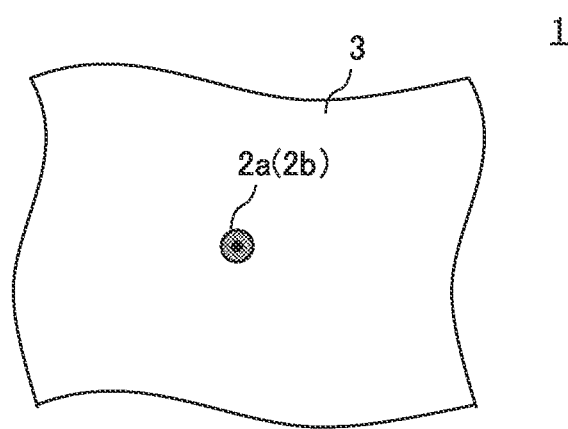
FIG. 3B is a perspective view of the anisotropic conductive sheet as viewed through it in plan from the first surface side in FIG. 3A.

As illustrated in FIGS. 3A and 3B, in anisotropic conductive sheet 1 for comparison, conduction path 2 is linearly formed in a cross-section along the thickness direction of insulation layer 3. That is, conduction path 2 does not have the non-linear part. As such, it is difficult to disperse the pressing force when an inspection object is disposed and pressed on the surface of anisotropic conductive sheet 1. Therefore, the terminal of the inspection object may be damaged due to the contact with first end portion 2a of conduction path 2 of anisotropic conductive sheet 1.

In contrast, in anisotropic conductive sheet 10 according to the present embodiment, conduction path 11 includes non-linear part 11c (see FIGS. 2A and 2B). Non-linear part 11c has an elasticity such that it expands and contracts in the thickness direction of insulation layer 12 (like a spring). In this manner, the force of pressing the inspection object disposed on the surface of anisotropic conductive sheet 10 can be dispersed at the portion of non-linear part 11c. In this manner, the damage of the terminal of the inspection object due to a contact with first end portion 11a of conduction path 11 of anisotropic conductive sheet 10 can be suppressed.

In addition, in the portion of non-linear part 11c, the contact area between conduction path 11 and insulation layer 12 increases, and therefore the adhesiveness between conduction path 11 and insulation layer 12 can also be increased. In this manner, the peeling of conduction path 11 from insulation layer 12 can be suppressed.

Manufacturing Method of Anisotropic Conductive Sheet

Figure 4A:
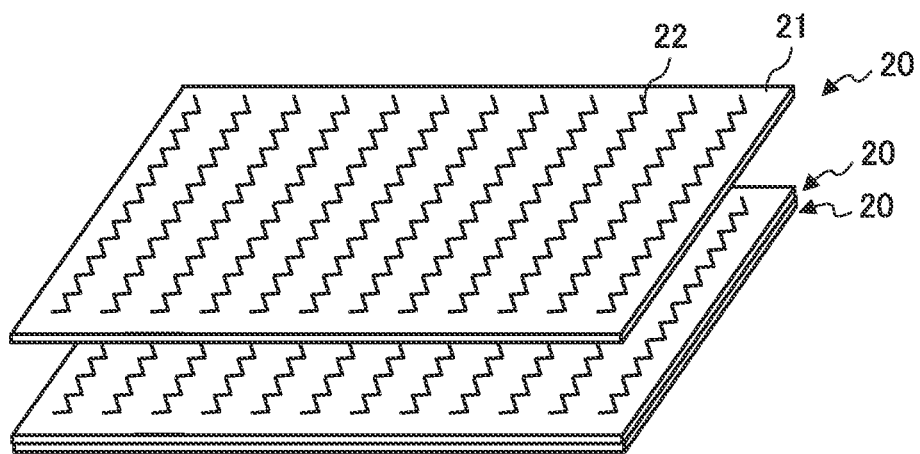
FIGS. 4A to 4C are schematic views illustrating a manufacturing process of the anisotropic conductive sheet according to Embodiment 1.
Figure 4B:
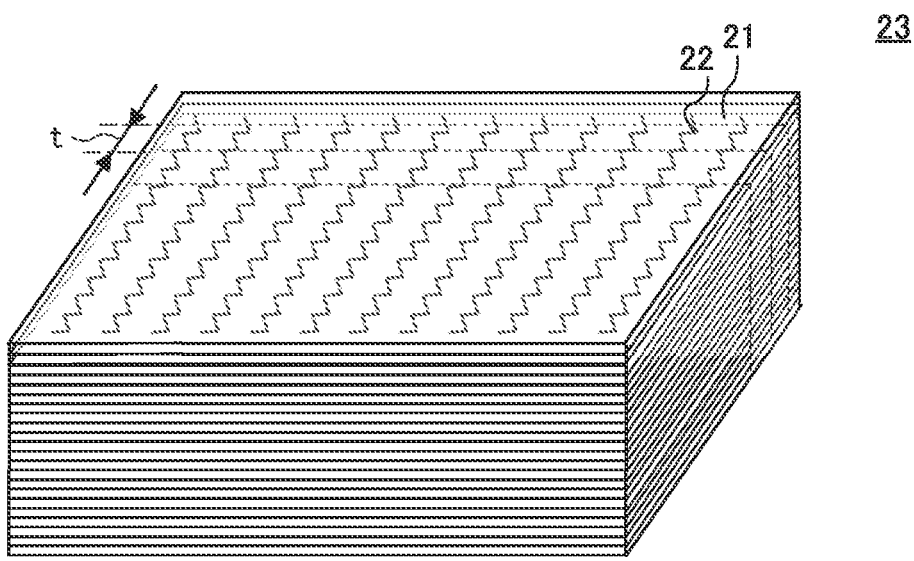
Figure 4C:
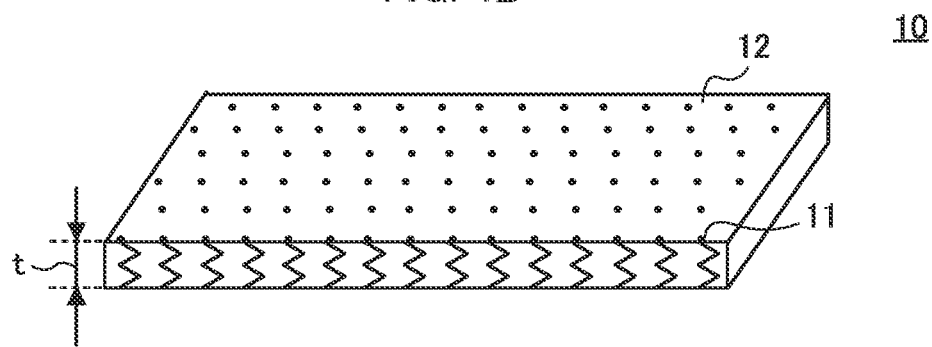

FIGS. 4A to 4C are schematic views illustrating a manufacturing process of anisotropic conductive sheet 10 according to the present embodiment.

As illustrated in FIGS. 4A to 4C, for example, anisotropic conductive sheet 10 according to the present embodiment can be obtained through: 1) a step of preparing a plurality of composite sheets 20 in which a plurality of conduction lines 22 is disposed at the surface of insulating sheet 21 (see FIG. 4A); 2) a step of obtaining laminated body 23 by stacking and sequentially integrating the plurality of composite sheets 20 (see FIGS. 4A and 4B); and 3) a step of obtaining anisotropic conductive sheet 10 by cutting the obtained laminated body 23 at a predetermined interval (see FIGS. 4B and 4C).

Step 1)

The plurality of composite sheets 20 in which the plurality of conduction lines 22 is disposed is prepared on the surface of insulating sheet 21.

Insulating sheet 21 may be a resin sheet (such as a silicone sheet) composed of the first resin composition that constitutes insulation layer 12.

The plurality of conduction lines 22 is disposed on the surface of insulating sheet 21 with a predetermined distance therebetween. Conduction line 22 can be disposed on the surface of insulating sheet 21 by any methods. For example, in the case where conduction line 22 is composed of a metal line, the metal line may be disposed as it is, a metal paste may be formed through drawing with a dispenser and the like, or a metal ink may be printed by an ink-jet manner.

Step 2)

The obtained composite sheets 20 are stacked and sequentially integrated (FIGS. 4A and 4B). Normally, the method of the integration may be, but not limited thereto, a thermocompression bonding, pressure bonding, or the like.

Block-shaped laminated body 23 is obtained by sequentially repeating the lamination and integration of composite sheets 20 (see FIG. 4B).

Step of 3)

Obtained laminated body 23 is cut in the direction intersecting (preferably, orthogonal to) the extending direction of conduction line 22 along the lamination direction at a predetermined interval (t) (the broken line of FIG. 4B). In this manner, anisotropic conductive sheet 10 with a predetermined thickness of the (t) can be obtained (FIG. 4C). That is, the plurality of conduction paths 11 in anisotropic conductive sheet 10 results from the plurality of conduction lines 22, and insulation layer 12 results from insulating sheet 21.

Other Steps 4)

The manufacturing method of anisotropic conductive sheet 10 according to the present embodiment may further include steps other than the above-mentioned steps 1) to 3) in accordance with the configuration of anisotropic conductive sheet 10. For example, it is possible to further include a step of forming electrolyte layer 13 on the surface of the obtained anisotropic conductive sheet 10 (see FIG. 8 described later).

Anisotropic conductive sheet 10 according to the present embodiment can be used for electrical testing.

Electrical Testing Apparatus and Electrical Testing Method

Electrical Testing Apparatus

Figure 5:
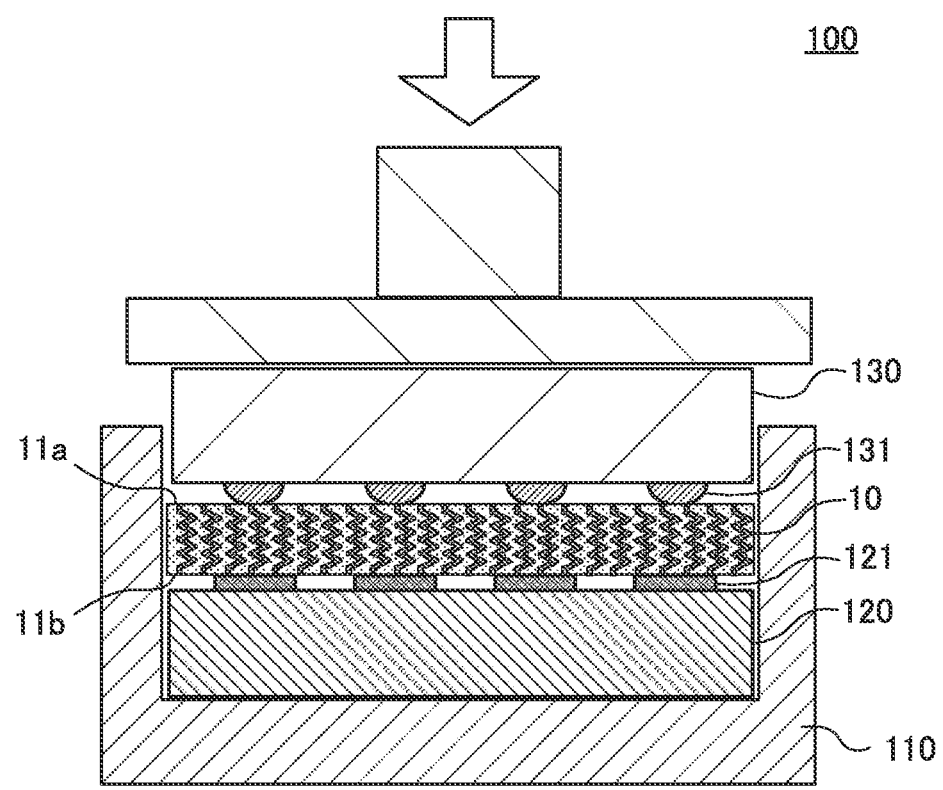
FIG. 5 is a sectional view illustrating an electrical testing apparatus according to Embodiment 1.

FIG. 5 is a sectional view illustrating electrical testing apparatus 100 according to the present embodiment.

Electrical testing apparatus 100, which uses anisotropic conductive sheet 10 illustrated in FIG. 1B, is an apparatus for inspecting electrical characteristics such as the continuity between terminals 131 of inspection object 130 (between measurement points), for example. It is to be noted that in this drawing, inspection object 130 is also illustrated from the viewpoint of describing the electrical testing method.

As illustrated in FIG. 5, electrical testing apparatus 100 includes holding container (socket) 110, inspection substrate 120, and anisotropic conductive sheet 10.

Holding container (socket) 110 is a container that holds inspection substrate 120, anisotropic conductive sheet 10 and the like.

Inspection substrate 120 is disposed in holding container 110, and provided with a plurality of electrodes 121 that faces the measurement points of inspection object 130 on the surface that faces inspection object 130.

Anisotropic conductive sheet 10 is disposed on the surface of inspection substrate 120 on which electrode 121 is disposed, such that the electrode 121 and electrolyte layer 13 on second surface 12b side in anisotropic conductive sheet 10 are in contact with each other.

Inspection object 130 is not limited, but is, for example, various semiconductor devices (semiconductor packages) such as HBM and PoP, electronic components, printed boards and the like. In the case where inspection object 130 is a semiconductor package, the measurement point may be a bump (terminal). In addition, in the case where inspection object 130 is a printed board, the measurement point may be a component mounting land or a measurement land provided in the conductive pattern.

Electrical Testing Method

An electrical testing method using electrical testing apparatus 100 illustrated in FIG. 5 is described below.

As illustrated in FIG. 5, the electrical testing method according to the present embodiment includes a step of electrically connecting electrode 121 of inspection substrate 120 and terminal 131 of inspection object 130 through anisotropic conductive sheet 10 by stacking inspection substrate 120 including electrode 121 and inspection object 130 with anisotropic conductive sheet 10 therebetween.

When performing the above-mentioned step, inspection object 130 may be pressurized (see FIG. 5), or may be brought into contact under a heated atmosphere as necessary from the viewpoint of facilitating sufficient conduction between electrode 121 of inspection substrate 120 and terminal 131 of inspection object 130 through anisotropic conductive sheet 10.

In the above-mentioned step, the surface (first surface 12a) of anisotropic conductive sheet 10 makes contact with terminal 131 of inspection object 130. In anisotropic conductive sheet 10 according to the present embodiment, conduction path 11 includes non-linear part 11c. Non-linear part 11c can have a spring-like elasticity for moving upward and downward in the thickness direction of insulation layer 12. In this manner, in comparison with a known anisotropic conductive sheet with a metal pin that is linearly formed and does not include non-linear part 11c, the force of pressing the inspection object disposed on the surface of anisotropic conductive sheet 10 can be dispersed at the portion of non-linear part 11c. In this manner, the damage of the terminal of the inspection object due to a contact with first end portion 11a of conduction path 11 of anisotropic conductive sheet 10 can be suppressed.

Modification

While virtual line A-A' connecting first end portion 11a and second end portion 11b of conduction path 11 is parallel to the thickness direction of insulation layer 12 (see FIG. 2A) in anisotropic conductive sheet 10 of the present embodiment described above, this is not limitative.

Figure 6A:
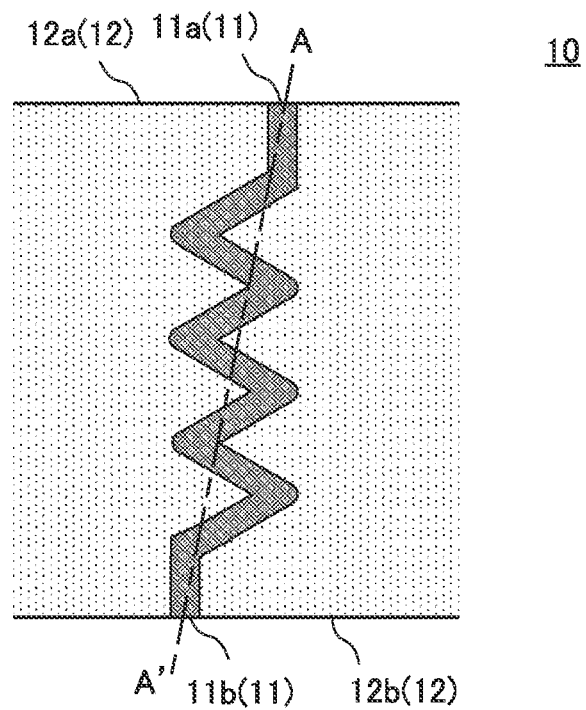
FIG. 6A is a partially enlarged sectional view of an anisotropic conductive sheet according to a modification.
Figure 6B:
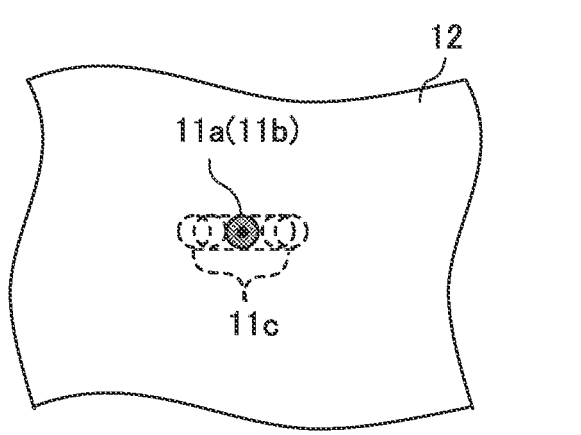
FIG. 6B is a perspective view of a conduction path as viewed through it in such a manner that a center of a first end portion and a center of a second end portion overlap each other in FIG. 6A.
Figures 7A, 7B, 7C, 7D:
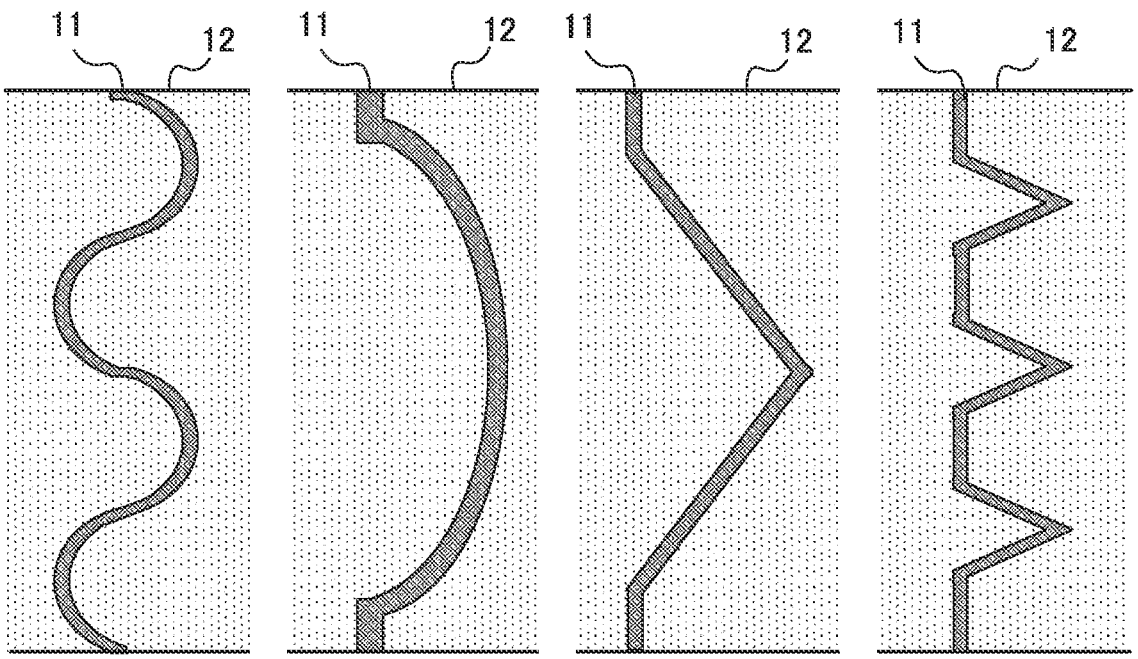
FIGS. 7A to 7G are partial sectional views illustrating anisotropic conductive sheet according to a modification.
Figures 7E, 7F, 7G:
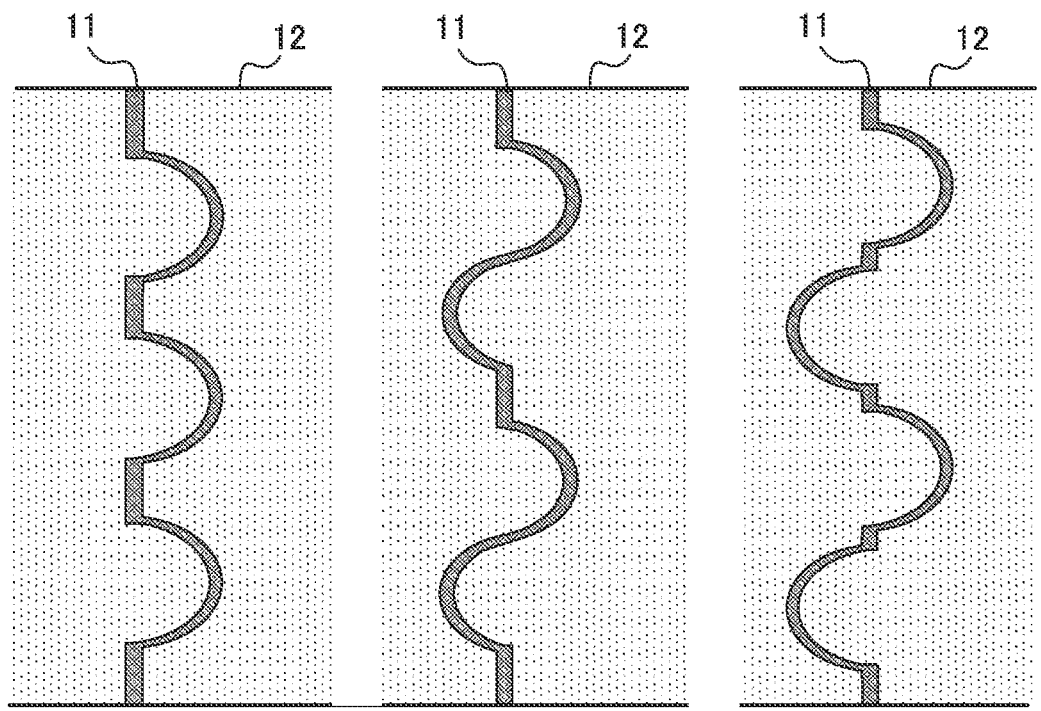

FIG. 6A is a partial sectional view illustrating anisotropic conductive sheet 10 according to a modification, and FIG. 6B is a perspective view of conduction path 11 as viewed through it in such a manner that the center of first end portion 11a and the center of second end portion 11b overlap each other in FIG. 6A.

As illustrated in FIG. 6A, virtual line A-A' connecting between first end portion 11a and second end portion 11b of conduction path 11 may not be completely parallel to the thickness direction of insulation layer 12.

In addition, while non-linear part 11c of conduction path 11 has a zigzag shape in anisotropic conductive sheet 10 in the present embodiment, this is not limitative.

FIGS. 7A to 7G are partial sectional views illustrating anisotropic conductive sheet 10 according to modifications. As illustrated in FIGS. 7A to 7G, the shape of non-linear part 11c of conduction path 11 may have a wavy shape (see FIG. 7A), an arch shape (see FIG. 7B), or a v shape (see FIG. 7C). In addition, the shape may be a combination of a linear part and a wavy shape, a zigzag shape, an arch shape or a v shape (see FIGS. 7A to 7G). Distance d and height h of these non-linear parts 11c are defined as described above.

In addition, in the present embodiment, anisotropic conductive sheet 10 may further include layers other than the above-mentioned layers, such as electrolyte layer 13 and bonding layer 14 as described above.

Electrolyte Layer 13

Figure 8:
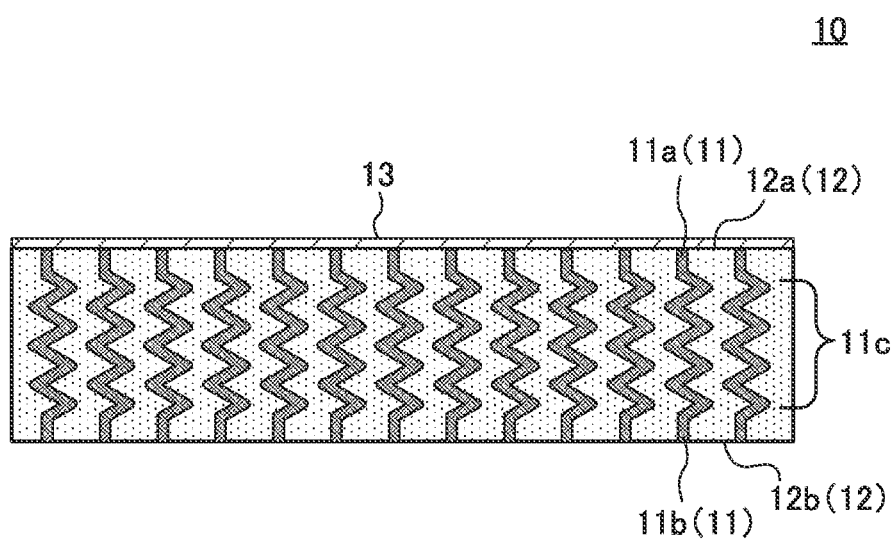
FIG. 8 is a sectional view of an anisotropic conductive sheet according to a modification.

FIG. 8 is a sectional view of anisotropic conductive sheet 10 according to a modification. As illustrated in FIG. 8, anisotropic conductive sheet 10 further includes electrolyte layer 13 disposed on the surface on first surface 12a side.

Electrolyte layer 13 is a coating including lubricant, and can be disposed on first end portion 11a of conduction path 11, for example. In this manner, when placing the inspection object on first surface 12a, deformation of the terminal of the inspection object can be suppressed, and adhesion of the electrode material of the inspection object to the surface of first end portion 11a of conduction path 11 can be suppressed without impairing the electrical connection with the terminal of the inspection object.

Examples of lubricants in the electrolyte layer 13 include fluoropolymer-based lubricants; lubricants based on inorganic materials such as boron nitride, silica, zirconia, silicon carbide, and graphite; hydrocarbon-based mold-releasing agents such as paraffin waxes, metallic soaps, natural and synthetic paraffins, polyethylene waxes, and fluorocarbons; fatty acid-based mold-releasing agents such as stearic acid, hydroxystearic acid, and other high-grade fatty acids and oxyfatty acids; fatty acid amide release agents such as stearic acid amides, fatty acid amides such as ethylene bis-stearoamide, and alkylene bis-fatty acid amides; alcohol-based release agents such as aliphatic alcohols such as stearyl alcohol and cetyl alcohol, polyhydric alcohols, polyglycols, and polyglycerols; fatty acid ester-based release agents such as aliphatic acid lower alcohol esters such as butyl stearate and pentaerythritol tetrastearate, fatty acid polyhydric alcohol esters, and fatty acid polyglycol esters; silicone based release agents such as silicone oils; and alkyl sulfonate metal salts. Among them, alkylsulfonic acid metal salts are preferred from the viewpoint that they have fewer adverse effects such as contaminating the electrodes of the inspection object, especially when used at high temperatures.

Metal salts of alkylsulfonic acids are preferably alkali metal salts of alkylsulfonic acids. Examples of alkali metal salts of alkylsulfonic acids include sodium 1-decanesulfonate, sodium 1-undecanesulfonate, sodium 1-dodecanesulfonate, sodium 1-tridecane sulfonate, sodium 1-tetradecane sulfonate, sodium 1-pentadecane sulfonate, sodium 1-hexadecane sulfonate, sodium 1-heptadecane sulfonate, sodium octadecane sulfonate, sodium nonadecane sulfonate, sodium eicosanedecane sulfonate, potassium 1-decane sulfonate, potassium 1-undecane sulfonate, potassium 1-dodecane sulfonate, potassium 1-tridecane sulfonate, potassium 1-tetradecane sulfonate, potassium 1-pentadecane sulfonate potassium, potassium 1-hexadecane sulfonate, potassium 1-heptadecane sulfonate, potassium 1-octadecane sulfonate, potassium 1-nonadecane sulfonate, potassium 1-eicosanedecasulfonate, lithium 1-decane sulfonate, lithium 1-undecane sulfonate, lithium 1-dodecane sulfonate, lithium 1-tridecane sulfonate, lithium 1-tetradecane sulfonate, lithium 1-pentadecane sulfonate, lithium 1-hexadecane sulfonate, lithium 1-heptadecanesulfonate, lithium 1-octadecanesulfonate, lithium 1-nonadecanesulfonate, lithium 1-eicosanedecasulfonate, and their isomers. Among them, the sodium salt of alkylsulfonic acid is particularly preferred because of its excellent heat resistance. One type of these may be used alone, and two or more complexes may be used in combination.

It is to be noted that the conductivity of conduction path 11 on the surface on first surface 12a side can be ensured by making the thickness of electrolyte layer 13 extremely thin.

Electrolyte layer 13 can be formed by any method, such as a method of applying the solution of electrolyte layer 13, for example. The solution of electrolyte layer 13 can be applied by known methods such as spraying, brushing, dropping of the solution of electrolyte layer 13, and dipping of anisotropic conductive sheet 10 into that solution.

In the applying methods, it is possible to appropriately use a method in which the material of the electrolyte layer 13 is diluted with a solvent such as alcohol, and the diluted solution (solution of the electrolyte layer 13) is applied to the surface of the anisotropic conductive sheet 10 (conduction path 11), and then the solvent is evaporated. Thus, the electrolyte layer 13 can be uniformly formed on the surface of the anisotropic conductive sheet 10 (on the conduction path 11 of the sheet).

In addition, in the case where the material of the electrolyte layer 13 that is in solid powder state at room temperature is used, it is possible to use a method in which an appropriate amount of it is put on the surface of anisotropic conductive sheet 10, and then it is applied by melting the material by heating anisotropic conductive sheet 10 to a high temperature.

Bonding Layer 14

Figure 9A:
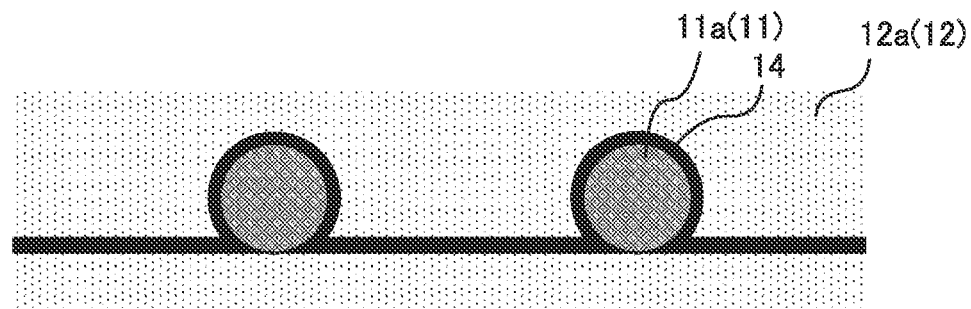
FIG. 9A is a partially enlarged view of a horizontal cross-section of an anisotropic conductive sheet according to a modification.
Figure 9B:
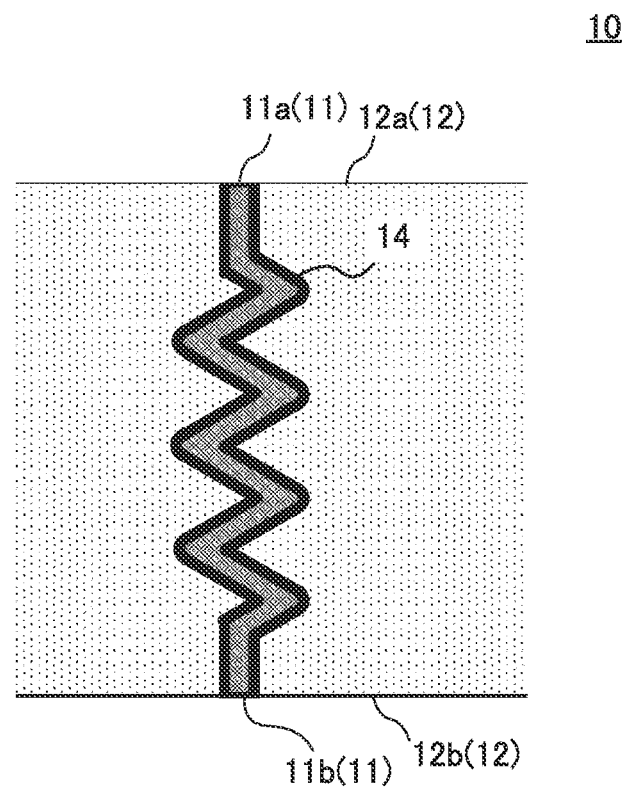
FIG. 9B is a partially enlarged view of a vertical cross section of an anisotropic conductive sheet according to a modification.

FIG. 9A is a partially enlarged view of a horizontal cross-section of anisotropic conductive sheet 10 according to a modification (a partial sectional view along the direction orthogonal to thickness direction), FIG. 9B is a partially enlarged view of a vertical cross section of anisotropic conductive sheet 10 of FIG. 9A (a partial sectional view along the thickness direction).

As illustrated in FIGS. 9A and 9B, anisotropic conductive sheet 10 may further include a plurality of bonding layers 14 disposed between the plurality of conduction paths 11 and insulation layer 12.

Bonding layer 14 is disposed at least a part between conduction path 11 and insulation layer 12 (at least a part of the side surface of conduction path 11). In the present embodiment, bonding layer 14 is disposed to surround the side surface of conduction path 11 (FIG. 9B). Bonding layer 14 increases the adhesiveness between conduction path 11 and insulation layer 12 to make it difficult to peel off at the boundary surface. That is, bonding layer 14 functions as a junction layer that increases the adhesiveness between conduction path 11 and insulation layer 12.

The material of bonding layer 14 is not limited as long as conduction path 11 and insulation layer 12 can be sufficiently bonded with each other without impairing the function of conduction path 11. The material of bonding layer 14 may be an organic-inorganic composite composition containing polycondensation products of alkoxysilane or its oligomers, or it may be a second resin composition.

Organic-Inorganic Composite Composition

The organic-inorganic composite composition contains polycondensation products of alkoxysilane or its oligomers.

Alkoxysilane is an alkoxysilane compound in which two to four alkoxy groups are bonded to silicon. That is, an alkoxysilane can be a bifunctional alkoxysilane, a trifunctional alkoxysilane, a tetrafunctional alkoxysilane, or a mixture of one or more of these. Among them, from the viewpoint of forming three-dimensional cross-links and facilitating sufficient adhesion, it is preferable that the alkoxysilane contains a trifunctional or tetrafunctional alkoxysilane, and it is more preferable that it contains a tetrafunctional alkoxysilane (tetraalkoxysilane). Oligomers of alkoxysilanes can be partially hydrolyzed and polycondensed alkoxysilanes.

Specifically, the alkoxysilane or its oligomer should preferably include, for example, the compound shown in Formula (1) below.

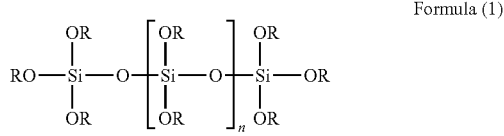

Formula (1)

In Formula (1), R is independently an alkyl group and n is an integer from 0 to 20. Examples of alkoxysilanes represented by Formula (1) include tetramethoxysilane, tetraethoxysilane, and tetrabutoxysilane.

The alkoxysilane or its oligomer may be commercially available. Examples of commercially available oligomers of alkoxysilane include Colcoat N-103X and Colcoat PX manufactured by Colcoat.

The organic-inorganic composite composition may further contain other components, such as conductive materials, silane coupling agents, and surfactants, as needed.

Second Resin Composition

The glass transition temperature of the second resin composition constituting bonding layer 14 is not limited, but it is preferably higher than the glass transition temperature of the first resin composition constituting insulation layer 12.

For example, preferably the glass transition temperature of the second resin composition is 150° C. or above, more preferably 160 to 600° C. The glass transition temperature of the second resin composition can be measured by the same method as the above-mentioned method.

The second resin composition constituting bonding layer 14 is not limited, but from the viewpoint of facilitating the development of adhesiveness, the second resin composition may be a cross-linked product of a composition containing an elastomer and a cross-linking agent (hereinafter also referred to as the "second elastomer composition"), or a resin composition containing a non-elastomeric resin or it may be a cured product of a resin composition containing a curable resin that is not an elastomer and a curing agent.

The elastomers included in the second elastomer composition can be the same as those listed as elastomers included in the first elastomer composition. The type of elastomer included in the second elastomer composition may be the same as or different from the type of elastomer included in the first elastomer composition. For example, from the viewpoint of facilitating increased affinity and adhesion between insulation layer 12 and adhesive layer 14, the type of elastomer contained in the second elastomer composition may be the same as the type of elastomer contained in the first elastomer composition.

The weight average molecular weight of the elastomer contained in the second elastomer composition is not limited, but from the viewpoint of making it easier to meet the glass transition temperature described above, it is preferable that it is higher than the weight average molecular weight of the elastomer contained in the first elastomer composition. The weight average molecular weight of the elastomer can be measured in polystyrene equivalent by gel permeation chromatography (GPC).

The crosslinking agent in the second elastomer composition can be selected as appropriate according to the type of elastomer, and the same crosslinking agent as listed for the crosslinking agent in the first elastomer composition can be used. The content of the crosslinking agent in the second elastomer composition is not particularly limited, but from the viewpoint of facilitating the satisfaction of the glass transition temperature described above, it is preferable to have a higher content than that of the crosslinking agent in the first elastomer composition. In addition, the degree of crosslinking (gel fraction) of the crosslinked material of the second elastomer composition should be higher than that of the crosslinked material of the first elastomer composition.

The same non-elastomeric resins (including curable resins) and curing agents included in the second resin composition can be used as the non-elastomeric resins and curing agents included in the first resin composition, respectively. The non-elastomeric resins included in the second resin composition are preferably polyimide, polyamide-imide, acrylic resin, and epoxy resin.

Among them, it is preferable that the second resin composition is a resin composition containing a non-elastomeric resin or a cured product of a resin composition containing a curable resin that is not an elastomer and a curing agent, from the viewpoint of making it easier to meet the glass transition temperature described above.

Thickness

The thickness of bonding layer 14 is not limited as long as it can achieve sufficient bonding between conduction path 11 and insulation layer 12 without impairing the function of conduction path 11. Normally, it is preferable that the thickness of bonding layer 14 be smaller than the circle equivalent diameter of conduction path 11. To be more specific, preferably, the thickness of bonding layer 14 is 1 µm or smaller, more preferably 0.5 µm or smaller.

In addition, bonding layer 14 may further be disposed in a region other than the region between conduction path 11 and insulation layer 12. In FIG. 9A, bonding layer 14 is additionally disposed in such a manner as to connect bonding layer 14 on the side surface of one conduction path 11 of two conduction paths 11 adjacent to each other and bonding layer 14 on the side surface of the other conduction path 11. In this manner, not only the adhesiveness between conduction path 11 and insulation layer 12, but also the adhesiveness between insulating sheets 21 described later that constitute insulation layer 12 can be increased (see FIGS. 10A and 10B described later). In this manner, even when pressurization and depressurization are repeated in electrical testing, peeling less occurs at the boundary surface between conduction path 11 and insulation layer 12 of anisotropic conductive sheet 10, and in addition, at the interface between insulating sheets 21 that constitute insulation layer 12. In addition, also at the step of cutting in the above-mentioned step 3), the peeling at the boundary surface between conduction path 11 and insulation layer 12, and the peeling at the interface between insulating sheets 21 that constitute insulation layer 12 can be made less occur.

Anisotropic conductive sheet 10 including bonding layer 14 can be manufactured by the following method.

Figure 10A:
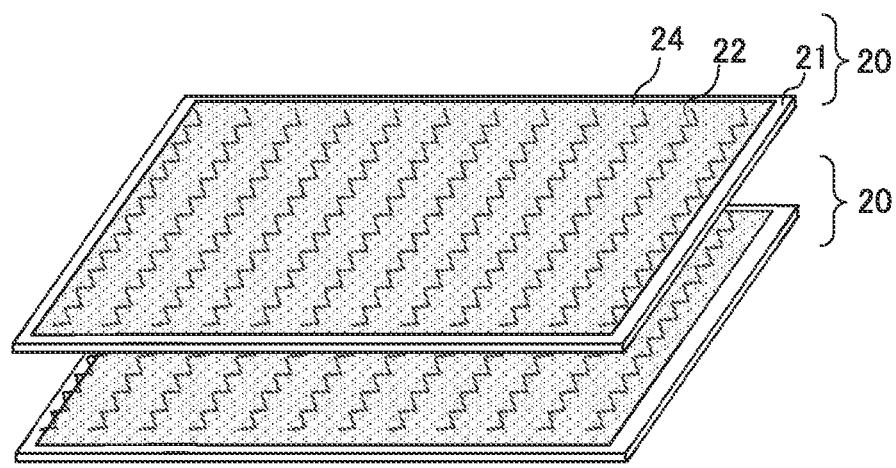
FIGS. 10A to 10C are schematic views illustrating a manufacturing process of the anisotropic conductive sheet of FIG. 9B.
Figure 10B:
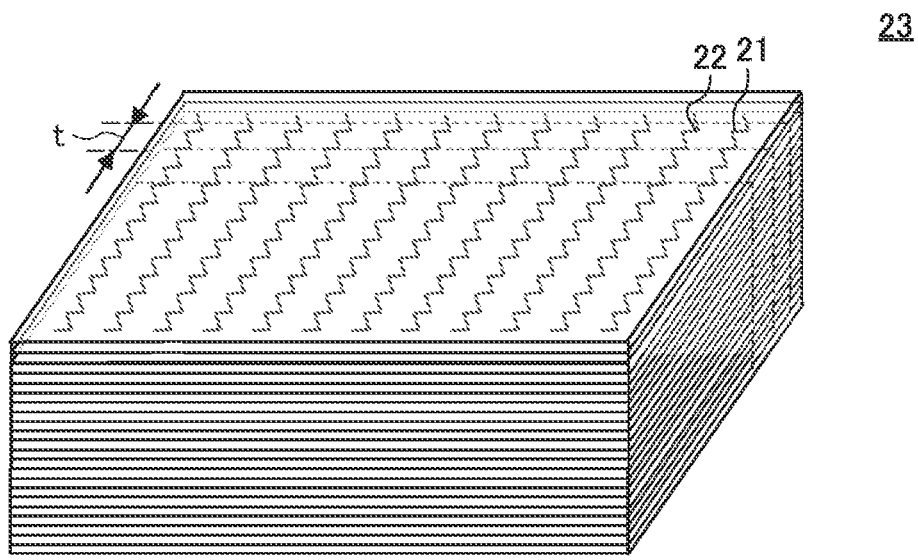
Figure 10C:
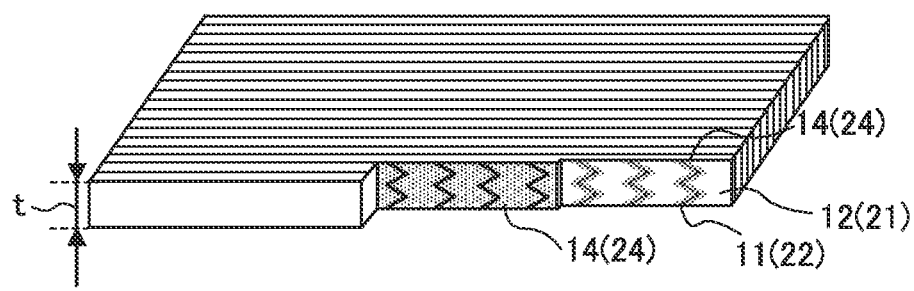

FIGS. 10A to 10C are schematic views illustrating a manufacturing process of anisotropic conductive sheet 10 according to a modification. It is to be noted that in FIG. 10C, the illustration of conduction path 11 in first surface 11a is omitted.

It can be manufactured in the same manner as the method described above except that at the step of the above-mentioned 1), composite sheet 20 including insulating sheet 21, the plurality of conduction lines 22, and bonding layer 24 that covers at least a part of the side surface thereof in this order is prepared (see FIG. 10A), and, at the step of the above-mentioned 2), the plurality of composite sheets 20 are stacked such that bonding layer 24 of one composite sheet 20 and insulating sheet 21 of the other composite sheet 20 are brought into contact with each other while sequentially integrating them (see FIGS. 10A to 10C).

At the step 1), composite sheet 20 can be obtained by any method. For example, the plurality of conduction lines 22 covered with bonding layer 24 may be disposed with a predetermined distance therebetween on the surface of insulating sheet 21; or after the plurality of conduction lines 22 is disposed with a predetermined distance therebetween on the surface of insulating sheet 21, bonding layer 24 may be formed in such a manner as to cover the plurality of conduction line 22. Bonding layer 24 may be formed by applying a solution containing the aforementioned alkoxysilane or its oligomer, or the aforementioned elastomer composition, or by laminating sheets thereof. In the present embodiment, composite sheet 20 can be obtained by further applying the above-mentioned solution or composition after the plurality of conduction lines 22 is disposed with a predetermined distance therebetween on the surface of insulating sheet 21 (see FIG. 10A).

The step 2) and the step 3) can be performed in the same manner as the steps described above. In this manner, anisotropic conductive sheet 10 with a predetermined thickness (t) can be obtained (see FIG. 10C). That is, in anisotropic conductive sheet 10, conduction path 11 results from conduction line 22, insulation layer 12 results from the integrated member of the plurality of insulating sheets 21, and bonding layer 14 results from bonding layer 24.

2. Embodiment 2

Anisotropic Conductive Composite Sheet

An anisotropic conductive composite sheet according to the present embodiment includes a first anisotropic conductive sheet (first anisotropic conductivity layer), and a second anisotropic conductive sheet (second anisotropic conductivity layer) stacked (fixed) on the first anisotropic conductive sheet. The anisotropic conductive composite sheet may be used for electrical testing, and it is preferable that the sheet be disposed such that the first anisotropic conductive sheet is on the inspection substrate side and the second anisotropic conductive sheet is on the inspection object side. At least one of the first anisotropic conductive sheet and the second anisotropic conductive sheet may be the above-described anisotropic conductive sheet (anisotropic conductive sheet 10 according to Embodiment 1).

In particular, anisotropic conductive sheet 10 according to Embodiment 1, which can easily achieve an elasticity of expanding and contracting in the thickness direction and can make the terminals of the object to be inspected less susceptible to damage, is preferably used as second anisotropic conductive sheet 50.

Figure 11A:
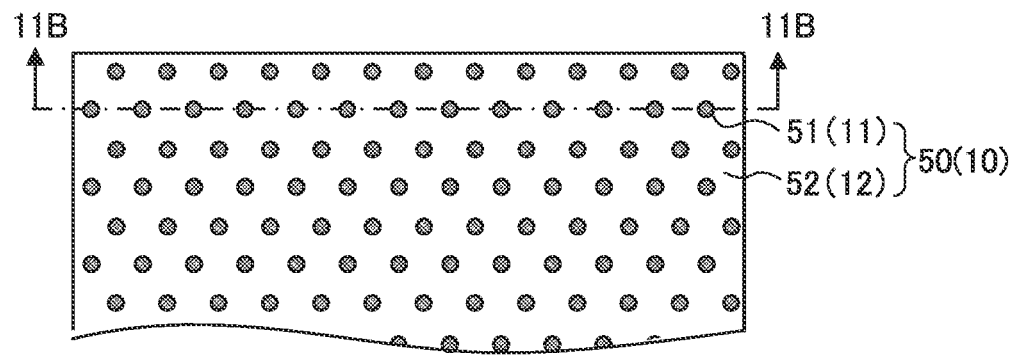
FIG. 11A is a plan view illustrating an anisotropic conductive composite sheet according to Embodiment 2.
Figure 11B:
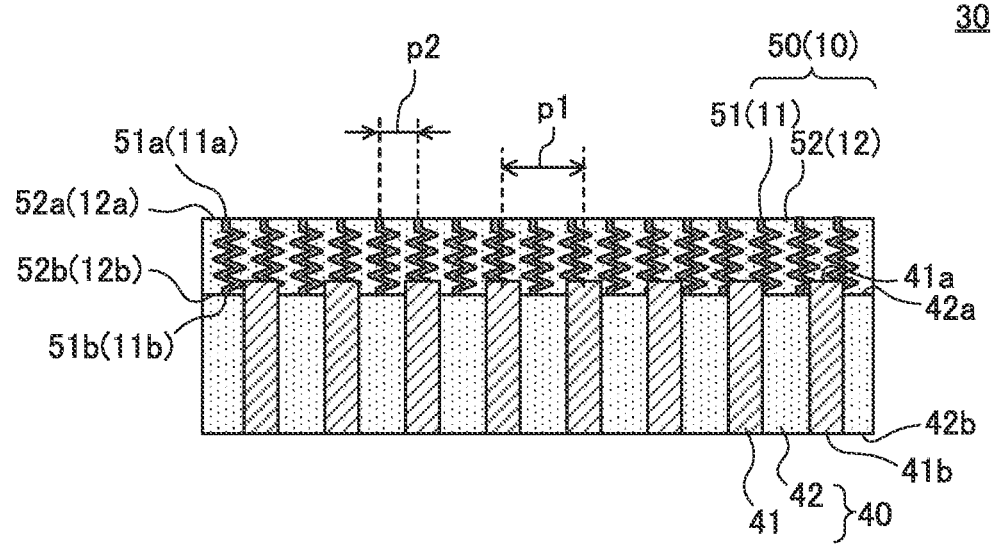
FIG. 11B is a sectional view taken along line 11B-11B of FIG. 11A.

FIG. 11A is a plan view illustrating anisotropic conductive composite sheet 30 according to the present embodiment, and FIG. 11B is a sectional view taken along line 11B-11B of FIG. 11A.

As illustrated in FIG. 11B, anisotropic conductive composite sheet 30 includes the first anisotropic conductive sheet (first anisotropic conductivity layer) 40, and second anisotropic conductive sheet (second anisotropic conductivity layer) 50 stacked on it. Second anisotropic conductive sheet 50 is the above-described anisotropic conductive sheet (anisotropic conductive sheet 10 according to Embodiment 1).

First Anisotropic Conductive Sheet

First anisotropic conductive sheet 40 includes a plurality of conduction paths 41 (first conduction paths) extending through it in the thickness direction, and insulation layer 42 (first insulation layer) that insulates them from each other and includes third surface 42a and fourth surface 42b (see FIG. 11B).

Conduction path 41 includes third end portion 41a extending through it in the thickness direction of first anisotropic conductive sheet 40 and exposed to third surface 42a side, and fourth end portion 41b exposed to fourth surface 42b side (see FIG. 11B). It is to be noted that as described above, the "thickness direction" means that the angle to the thickness direction of insulation layer 42 is ±10° or smaller.

Preferably, center-to-center distance p1 (pitch) of third end portions 41a of the plurality of conduction paths 41 is greater than center-to-center distance p2 (pitch) of fifth end portions 51a of a plurality of conduction paths 51 of second anisotropic conductive sheet 50 from the viewpoint of easily ensuring the conductivity in the thickness direction (see FIG. 11B). To be more specific, although it depends on center-to-center distance p2 of the plurality of conduction paths 51 of fifth end portion 51a of second anisotropic conductive sheet 50, center-to-center distance p1 of third end portions 41a of the plurality of conduction paths 41 of first anisotropic conductive sheet 40 may be 55 to 650 µm, for example.

It is to be noted that as in Embodiment 1, center-to-center distance p1 of third end portions 41a of the plurality of conduction paths 41 and the center-to-center distance of fourth end portions 41b (or center-to-center distance p2 of fifth end portions 51a of the plurality of conduction paths 51 and the center-to-center distance of sixth end portions 51b) may be the same or different from each other. In the present embodiment, center-to-center distance p1 of third end portions 41a of the plurality of conduction paths 41 (or center-to-center distance p2 of fifth end portions 51a of the plurality of conduction paths 51) and the center-to-center distance of fourth end portions 41b (or the center-to-center distance of sixth end portions 51b) are the same, and they are referred to also as the center-to-center distance of the plurality of conduction paths 41 (or the center-to-center distance of the plurality of conduction paths 51).

Conduction path 41 is exposed to both surfaces of first anisotropic conductive sheet 40. In the present embodiment, from the viewpoint of increasing the electrical contact with second anisotropic conductive sheet 50, it is preferable that conduction path 41 of first anisotropic conductive sheet 40 protrude than insulation layer 42 in the thickness direction at the surface of first anisotropic conductive sheet 40 on which second anisotropic conductive sheet 50 is stacked (see FIG.

11B). For example, the protruding height of conduction path 41 may be, but not limited thereto, 10 to 40 µm, or more preferably 15 to 30 µm. The circle equivalent diameter of conduction path 41 is not limited as long as the continuity can be ensured, and may be approximately 20 to 200 µm, for example.

The material of conduction path 41 may be the same as the above-mentioned materials for conduction path 11, or preferably metal materials.

Insulation layer 42 is disposed to fill the gap between the plurality of conduction paths 41 and insulates the plurality of conduction paths 41 from each other (see FIG. 11B).

Examples of the material of insulation layer 42 include the above-mentioned material for insulation layer 12, or preferably the cross-linked product of the first elastomer composition.

The rockwell hardness of the surface of first anisotropic conductive sheet 40 is not limited, and normally, may be substantially the same as the rockwell hardness of conduction path 41 (e.g., 90 to 100% of the rockwell hardness of conduction path 41). The reason for this may be that since the circle equivalent diameter and center-to-center distance p1 of third end portion 41a of conduction path 41 are relatively large, the percentage of the surface area of insulation layer 42 that makes contact with a measurement indenter is small (when the measurement indenter is applied to the center of the cross-section of conduction path 41), and that conduction path 41 protrudes than insulation layer 42 at the surface (third surface 42a of insulation layer 42) of first anisotropic conductive sheet 40 on which second anisotropic conductive sheet 50 is stacked. The rockwell hardness of the surface of first anisotropic conductive sheet 40 can be measured using a hardness meter in accordance with ASTM D785 as described later.

Second Anisotropic Conductive Sheet

Second anisotropic conductive sheet 50 includes the plurality of conduction paths 51 (second conduction paths) formed along the thickness direction, and insulation layer 52 (second insulation layer) filling the gaps therebetween and including fifth surface 52a and sixth surface 52b (see FIGS. 11A and 11B). To be more specific, they are stacked such that third surface 42a of first insulation layer 42 of first anisotropic conductive sheet 40 and sixth surface 52b of second insulation layer 52 of second anisotropic conductive sheet 50 face each other (see FIG. 11B).

Then, second anisotropic conductive sheet 50 may be anisotropic conductive sheet 10 according to Embodiment 1. That is, in second anisotropic conductive sheet 50, conduction path 51 (second conduction path) corresponds to conduction path 11 in the above-mentioned anisotropic conductive sheet 10, and insulation layer 52 (second insulation layer) corresponds to insulation layer 12 in the above-mentioned anisotropic conductive sheet 10. Likewise, fifth end portion 51a and sixth end portion 51b of conduction path 51 correspond to first end portion 11a and second end portion 11b of conduction path 11, respectively, and fifth surface 52a and sixth surface 52b of insulation layer 52 correspond to first surface 12a and second surface 12b of insulation layer 12, respectively.

Center-to-center distance p2 (pitch) of fifth end portions 51a of the plurality of conduction paths 51 in second anisotropic conductive sheet 50 is smaller than center-to-center distance p1 (pitch) of third end portions 41a of the plurality of conduction paths 41 in first anisotropic conductive sheet 40. To be more specific, preferably, center-to-center distance p2 of fifth end portions 51a of the plurality of conduction paths 51 is 18 to 31% of the center-to-center distance p1 of third end portions 41a of the plurality of conduction paths 41. With center-to-center distance p2 of fifth end portions 51a of the plurality of conduction paths 51 sufficiently smaller than center-to-center distance p1 of third end portions 41a of the plurality of conduction paths 41, the need for alignment of inspection objects can be eliminated. Center-to-center distance p2 of fifth end portions 51a of the plurality of conduction paths 51 may be 10 to 200 µm, for example. In addition, normally, the circle equivalent diameter of fifth end portion 41a of conduction path 51 is smaller than the circle equivalent diameter of third end portion 41a of conduction path 41.

Insulation layer 52 is disposed to fill the gap between the plurality of conduction paths 51 and insulates them from each other. As the material of insulation layer 52, the same material as that of insulation layer 42 may be used except that it is selected such that the rockwell hardness of the surface of second anisotropic conductive sheet 50 satisfies the range described later. For example, from the viewpoint of easily integrating second anisotropic conductive sheet 50 and first anisotropic conductive sheet 40, the material of insulation layer 52 and the material of insulation layer 42 may be the same.

Preferably, the rockwell hardness of the surface (preferably fifth surface 52a) of second anisotropic conductive sheet 50 is lower than the rockwell hardness of the surface (preferably third surface 42a) of first anisotropic conductive sheet 40. As described above, in first anisotropic conductive sheet 40, the circle equivalent diameter and center-to-center distance p1 of third end portion 41a of conduction path 41 are relatively large, and therefore the percentage of the surface area of the insulating material that makes contact with the indenter is small; whereas in second anisotropic conductive sheet 50, the circle equivalent diameter and center-to-center distance p2 of fifth end portion 51a of conduction path 51 are relatively small, and therefore the percentage of the surface area of the insulating material that makes contact with the indenter tends to be large. As a result, conceivably, the rockwell hardness of the surface of second anisotropic conductive sheet 50 is substantially the same as the rockwell hardness between the metal line and the insulating material (preferably an insulating material), and is lower than the surface the rockwell hardness of first anisotropic conductive sheet 40 that is substantially the same as the rockwell hardness of conduction path 41. To be more specific, preferably, the rockwell hardness of the surface of second anisotropic conductive sheet 50 is M120 or smaller. Such a second anisotropic conductive sheet 50 has a suitable flexibility, and can be less damaged by the terminal of the inspection object conduction path 51 and the like in comparison with the case where first anisotropic conductive sheet 40 is in direct contact with the inspection object.

The rockwell hardness of the surface of second anisotropic conductive sheet 50 can be measured by complying with ASTM D785. To be more specific, after second anisotropic conductive sheet 50 is cut into a predetermined size, the rockwell hardness of the M scale of the obtained test specimen is measured using a hardness meter in accordance with ASTM D785.

The rockwell hardness of the surface of second anisotropic conductive sheet 50 can be adjusted by the percentage of the area of the insulating material (insulation layer 52) with respect to the surface area of second anisotropic conductive sheet 50.

To set the rockwell hardness of the surface of second anisotropic conductive sheet 50 to M120 or smaller, it is preferable to 1) increase the percentage of the surface area of the insulating material (insulation layer 52) with respect to the surface area of second anisotropic conductive sheet 50, for example than that of first anisotropic conductive sheet 40, for example. To be more specific, it is preferable to set the percentage of the surface area of insulation layer 52 with respect to the surface area of second anisotropic conductive sheet 50 to 75% or greater. The percentage of the surface area of insulation layer 52 can be calculated from the two-dimensional information obtained through observation of the surface of second anisotropic conductive sheet 50 using a scanning electron microscope.

Percentage (%) of Surface Area of Insulation Layer 52=Surface Area of Insulation Layer 52/Surface Area of Second Anisotropic Conductive Sheet 50×100    (Formula (1))

In the case where conduction path 51 is a metal line, the percentage of the surface area of the insulating material (insulation layer 52) may be adjusted by the center-to-center distance p2 and the circle equivalent diameter of the metal line, for example. To increase the percentage of the surface area of the insulating material (insulation layer 52), it is preferable to set the circle equivalent diameter of the metal line to a small value, and set center-to-center distance p2 to a large value (within a range smaller than center-to-center distance p1), for example.

In addition, to set the rockwell hardness of the surface of second anisotropic conductive sheet 50 to M120 or smaller, it is preferable to 2) set the protruding height of the metal line from the surface of second anisotropic conductive sheet 50 to a small value, for example, than that of first anisotropic conductive sheet 40, in the case where conduction path 51 is a metal line. To be more specific, it is preferable that conduction path 51 do not protrude from the surface of second anisotropic conductive sheet 50. The reason for this is that conduction path 51 protruded from the surface of second anisotropic conductive sheet 50 likely to affect the rockwell hardness.

It is preferable that the thickness of second insulation layer 52 of second anisotropic conductive sheet 50 be smaller than the thickness of first insulation layer 42 of first anisotropic conductive sheet 40. That is, normally, second anisotropic conductive sheet 50 has a larger conduction resistance value than that of first anisotropic conductive sheet 40. Therefore, when the ratio of the thickness of second anisotropic conductive sheet 50 is suitably small, the conduction resistance value of the entire anisotropic conductive composite sheet 30 does not excessively increase, and thus the inspection accuracy is less impaired. Preferably, the thickness of second insulation layer 52 of second anisotropic conductive sheet 50 is 20 to 100 μm, for example, from the viewpoint of not excessively increasing the conduction resistance value of the entire anisotropic conductive composite sheet 30 and the like. The thicknesses of second insulation layer 52 and first insulation layer 42 may be measured by the same method as the above-described method.

The ratio T2/T1 of thickness T2 of second insulation layer 52 of second anisotropic conductive sheet 50 and thickness T1 of first insulation layer 42 of first anisotropic conductive sheet 40 may be set to approximately 1/4 to 1/10.

Layer Configuration

Second anisotropic conductive sheet 50 may be stacked only on one surface of first anisotropic conductive sheet 40, or on both surfaces. In the present embodiment, second anisotropic conductive sheet 50 is stacked on one surface (the side that makes contact with the terminal of the inspection object) of first anisotropic conductive sheet 40. The inspection object is disposed on the surface (the surface opposite to the side of first anisotropic conductive sheet 40) of second anisotropic conductive sheet 50.

Operation

With anisotropic conductive composite sheet 30 according to the present embodiment, the following effect can be provided in addition to the effect described in the above-mentioned Embodiment 1.

Specifically, a known common anisotropic conductive sheet has a favorable conductivity in the thickness direction, but the metal pin (referred to as a metal line) that is a conduction path is exposed or protruded at the surface of anisotropic conductive sheet. As such, when aligning the terminal of the inspection object and performing electrical testing on the anisotropic conductive sheet, the terminal of the inspection object is easily damaged by making contact with the exposed or protruded metal line. In addition, as the wiring density of inspection objects becomes higher, i.e., the pitch between terminals becomes finer, it is difficult to align (alignment) the terminals of inspection objects with high accuracy.

In contrast, in the present embodiment, anisotropic conductive sheet 10 according to Embodiment 1 (second anisotropic conductive sheet 50) is provided on the known anisotropic conductive sheet (first anisotropic conductive sheet 40) for example. As described above, anisotropic conductive sheet 10 according to Embodiment 1 can easily provide the elasticity of expanding and contracting in the thickness direction, and can make the terminal of the inspection object less susceptible to damage, and it is thus possible to suppress the damage of the inspection object due to the contact with the metal line. In addition, by setting a small center-to-center distance p2 of first end portion 11a of conduction path 11 of anisotropic conductive sheet 10 according to Embodiment 1 (second anisotropic conductive sheet 50), it is possible to eliminate the need for the positioning (alignment).

Manufacturing Method of Anisotropic Conductive Composite Sheet

Anisotropic conductive composite sheet 30 of the present disclosure can be manufactured by any method. For example, anisotropic conductive composite sheet 30 can be obtained through: 1) a step of preparing first anisotropic conductive sheet 40 and second anisotropic conductive sheet 50; and 2) a step of stacking first anisotropic conductive sheet 40 and second anisotropic conductive sheet 50 and then integrating them by thermo-compression bonding and the like.

Step 1)

First anisotropic conductive sheet 40 can be manufactured by any method. For example, first anisotropic conductive sheet 40 as illustrated in FIGS. 11A and 11B can be obtained by obtaining a laminated body in which a layer in which a plurality of long metal lines is arranged at a predetermined pitch such that they do not make contact with each other (a layer composed of a metal line) and an insulating sheet are alternately stacked, and then cutting the obtained laminated body in the direction parallel to the lamination direction (or in the direction perpendicular to the metal line) in a predetermined thickness.

In the case where conduction path 51 of second anisotropic conductive sheet 50 is a metal line (see FIG. 11B), it can be manufactured by the same method as that described above.

Step 2)

First anisotropic conductive sheet 40 and second anisotropic conductive sheet 50 can be integrated with each other by any method such as thermo-compression bonding, for example.

It is to be noted that while first anisotropic conductive sheet 40 and second anisotropic conductive sheet 50 are integrated with each other (composite sheet) in FIGS. 11A and 11B, this is not limitative, and first anisotropic conductive sheet 40 and second anisotropic conductive sheet 50 may not be integrated with each other, and may be stacked when they are used.

Anisotropic Conductive Sheet Set

Figure 12:
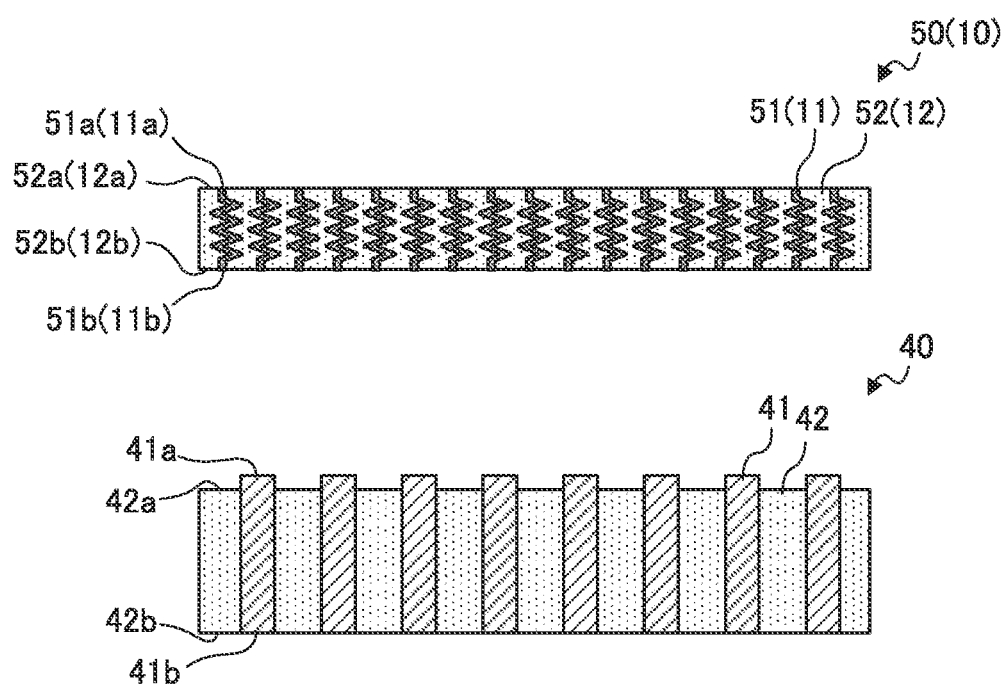
FIG. 12 is a sectional view illustrating an anisotropic conductive sheet set according to Embodiment 2.

FIG. 12 is a sectional view illustrating anisotropic conductive sheet set 60 according to the present embodiment.

Anisotropic conductive sheet set 60 includes first anisotropic conductive sheet 40, and second anisotropic conductive sheet 50 configured to be stacked on at least one surface of it. To be more specific, anisotropic conductive sheet set 60 is used with third surface 42a of first insulation layer 42 of anisotropic conductive sheet 40 and sixth surface 52b of second insulation layer 52 of second anisotropic conductive sheet 50 are stacked to face each other (see FIG. 12). First anisotropic conductive sheet 40 and second anisotropic conductive sheet 50 are configured in the same manner as the above-described first anisotropic conductive sheet 40 and second anisotropic conductive sheet 50, respectively.

From the viewpoint of reducing the interface resistance between first anisotropic conductive sheet 40 and second anisotropic conductive sheet 50 and the like, the surface of second anisotropic conductive sheet 50 that makes contact with first anisotropic conductive sheet 40 may be provided with a surface shape (e.g., convex or concave) that mates with the surface shape of first anisotropic conductive sheet 40.

In addition, as described above, it is preferable that an inspection object is disposed at the surface of second anisotropic conductive sheet 50 (the surface on the side opposite to first anisotropic conductive sheet 40).

As described above, since first anisotropic conductive sheet 40 and second anisotropic conductive sheet 50 are not integrated with each other, the configuration of the anisotropic conductive sheet can be freely changed in accordance with the type of the inspection object. In addition, even when they are not integrated with each other, electrical connection can be sufficiently performed by exerting a pressure at the time of contact with the terminal of the inspection object.

As described above, anisotropic conductive composite sheet 30 and anisotropic conductive sheet set 60 can be favorably used for electrical testing of inspection objects such as semiconductor devices.

Electrical Testing Apparatus and Electrical Testing Method

Figure 13:
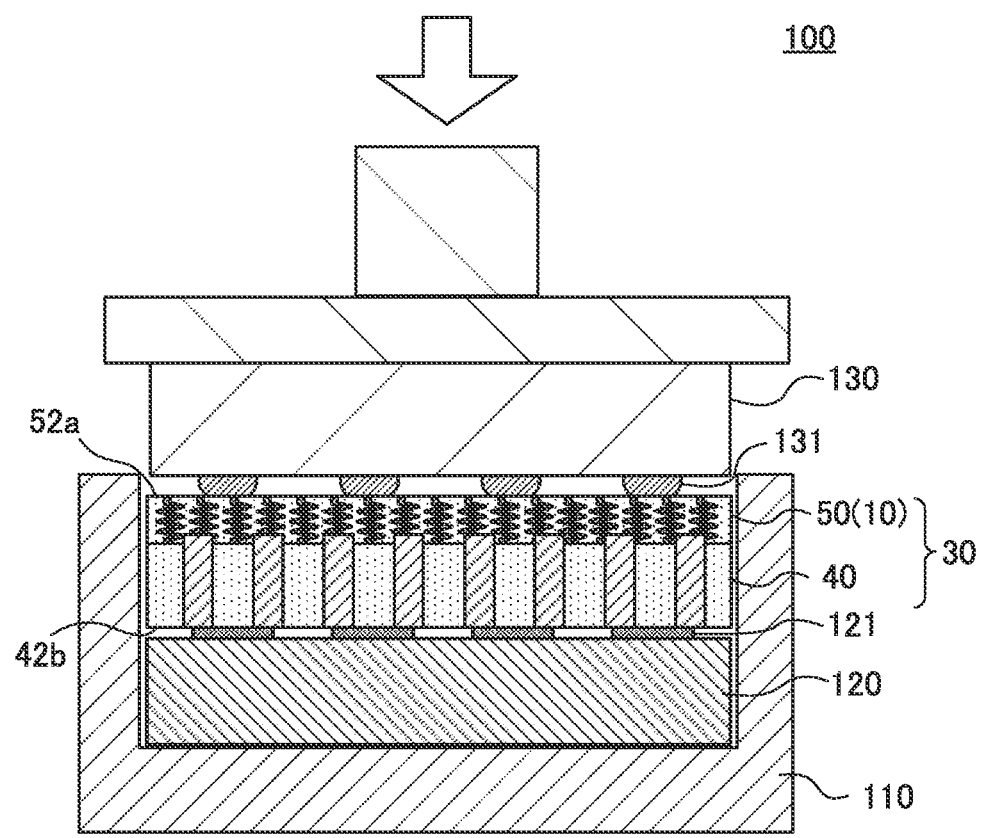
FIG. 13 is a sectional view illustrating an electrical testing apparatus according to Embodiment 2.

FIG. 13 is a sectional view illustrating electrical testing apparatus 100 according to the present embodiment.

As illustrated in FIG. 13, electrical testing apparatus 100 has the same configuration as that of the above-mentioned Embodiment 1 except that anisotropic conductive composite sheet 30 or a laminated of anisotropic conductive sheet set 60 is disposed on the surface of inspection substrate 120 on which electrode 121 is disposed such that the electrode 121 and metal line 11 make contact with each other. Then, the surface of second anisotropic conductive sheet 20 that constitutes anisotropic conductive composite sheet 30 or the laminated of anisotropic conductive sheet set 60 is disposed in contact with the terminal of inspection object 130.

Then, in the present embodiment, the rockwell hardness of the surface of second anisotropic conductive sheet 50 that makes contact with terminal 131 of inspection object 130 is, preferably, as low as M120 to have a suitable flexibility. In this manner, even when it is pressed with terminal 131 of inspection object 130 put thereon, damage of the terminal 131 of inspection object 130 due to second anisotropic conductive sheet 50 can be suppressed. In addition, second center-to-center distance p2 of fifth end portions 51a of the plurality of conduction paths 51 of anisotropic conductive sheet 50 is significantly smaller than that of first anisotropic conductive sheet 40, it is possible to eliminate the need for the positioning (alignment) of terminal 131 of inspection object 130.

Modification

While second anisotropic conductive sheet 50 is anisotropic conductive sheet 10 according to Embodiment 1 in the present embodiment, this is not limitative, and first anisotropic conductive sheet 40 may be anisotropic conductive sheet 10 according to Embodiment 1.

Figure 14A:
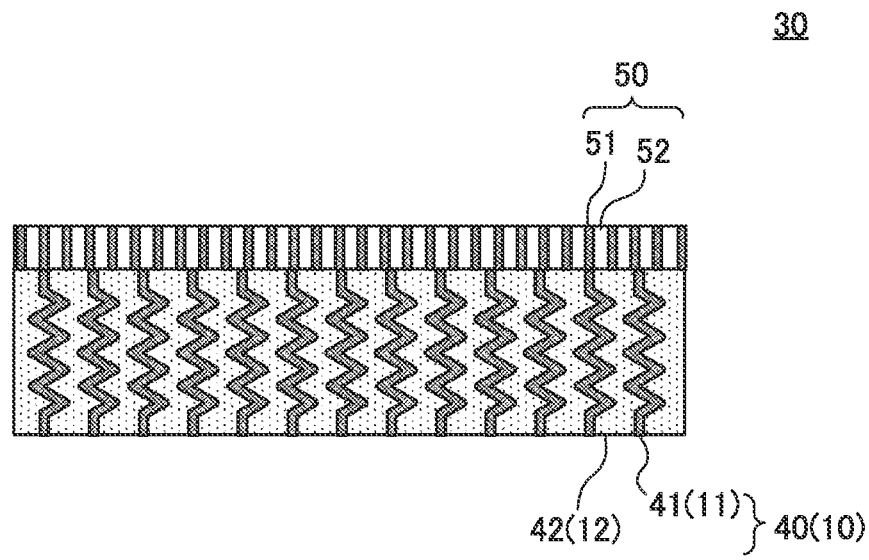
FIGS. 14A and 14B illustrate an anisotropic conductive composite sheet according to a modification.
Figure 14B:
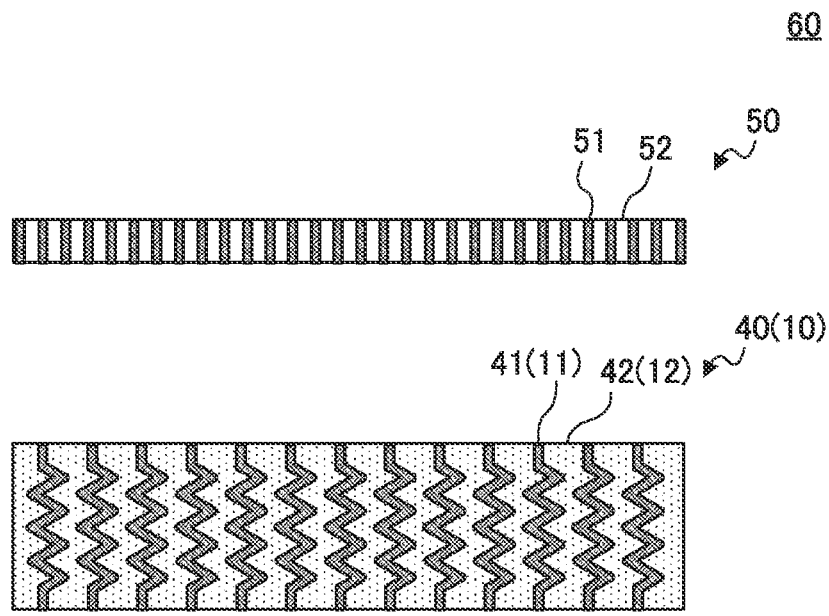
Figure 15A:
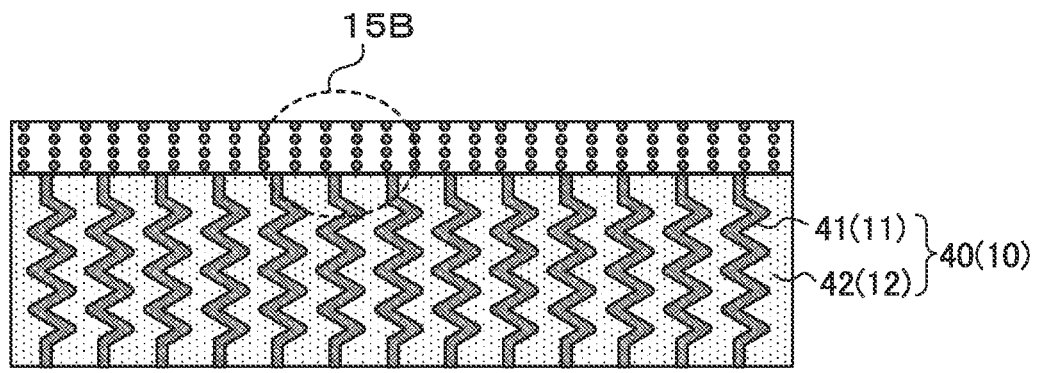
FIGS. 15A to 15C illustrate an anisotropic conductive composite sheet according to a modification.

FIG. 14A is a sectional view illustrating anisotropic conductive composite sheet 30 according to a modification, and FIG. 14B is a sectional view illustrating anisotropic conductive sheet set 60 according to a modification. FIG. 15 is a sectional view illustrating anisotropic conductive composite sheet 30 according to the modification. FIG. 15A illustrates a case where second anisotropic conductive sheet 50 is a dispersion type anisotropic conductive sheet in FIG. 14A, FIG. 15B is an enlarged view of broken line part 15B of FIG. 15A, and FIG. 15C illustrates a case where second anisotropic conductive sheet 50 is an anisotropic conductive sheet of an uneven type in FIG. 14A.

As described above, first anisotropic conductive sheet 40 may be anisotropic conductive sheet 10 according to Embodiment 1 (see FIGS. 14A and 14B, and FIGS. 15A to 15C).

Figure 15B:
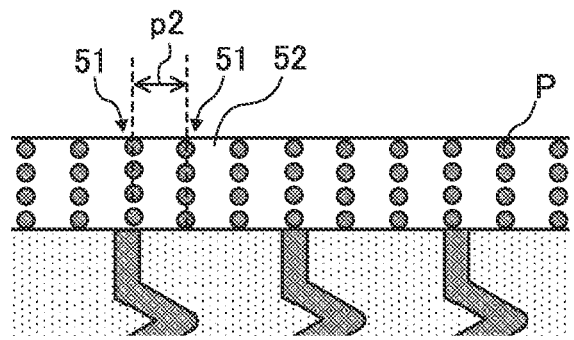
Figure 15C:
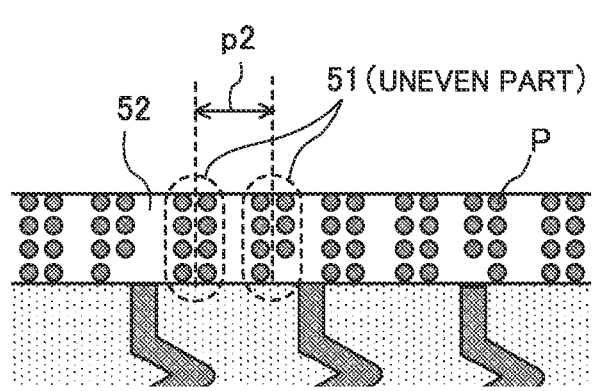

In addition, conduction path 51 of second anisotropic conductive sheet 50 may be composed of a plurality of conductive particles dispersed in an insulating material and configured to form a conduction path in the thickness direction in a pressed state or non-pressed state (see FIGS. 15A to 15C). To be more specific, as illustrated in FIGS. 15A and 15B, second anisotropic conductive sheet 50 may include an insulating material, and a plurality of conductive particles dispersed therein. From the viewpoint of obtaining sufficient continuity without the need for alignment, it is preferable that the plurality of conductive particles be aligned in the thickness direction of the sheet. The number of conductive particles aligned in the thickness direction may be one or more. The conductive particles aligned in the thickness direction may be dispersed in the entirety of the sheet (dispersed type, see FIGS. 15A and 15B), or regularly unevenly distributed (uneven type, see FIG. 15C).

It suffices that conduction path 51 of second anisotropic conductive sheet 50 is a member that conducts in the thickness direction in a non-pressed state or a pressed state (see FIGS. 15A to 15C). From the viewpoint of eliminating the need for alignment, the volume resistivity with conduction of conduction path 51 satisfies the above-described range, or preferably $1.0 \times 10 \times 10^{-4}$ to $1.0 \times 10 \times 10^{-5}$ Ω-cm.

Second anisotropic conductive sheet 50 includes a plurality of conductive particles P aligned in the thickness direction as conduction path 51 (see FIGS. 15A to 15C). The plurality of conductive particles P aligned in the thickness direction is dispersed over the entire sheet.

Preferably, conductive particles P are, but not limited thereto, conductive magnetic substance particles from the viewpoint of alignment in the thickness direction and the like, for example. Examples of conductive magnetic particles include particles made of magnetic metals such as iron, nickel, and cobalt or their alloys, or those plated with conductive metals such as gold, silver, copper, tin, palladium, and rhodium.

The median diameter (d50) of the conductive particles P is, but not limited thereto, 5 to 100 μm, preferably 10 to 50 μm, for example. The median diameter of the conductive particles P can be measured by a light scattering method, for example, a laser analysis and scattering particle size analyzer.

In the case where conduction path 51 is composed of the plurality of conductive particles P aligned in the thickness direction, center-to-center distance p2 of the plurality of conduction paths 51 is specified as follows. Specifically, in the case of the dispersion type illustrated in FIGS. 15A and 15B, the distance between the center lines (lines each connecting the centers of the plurality of conductive particles P aligned in the thickness direction) of the plurality of conductive particles P aligned in the thickness direction is set as center-to-center distance p2 of the plurality of conduction paths 51 (see FIG. 15B). On the other hand, in the case of the uneven type illustrated in FIG. 15C, the uneven part is regarded as one conduction path 51, and the distance between each center line of the uneven part is set as center-to-center distance p2 of the plurality of conduction paths 51 (see FIG. 15C).

Second anisotropic conductive sheet 50 in which conduction path 51 is composed of conductive particles P (see FIGS. 15A to 15C) can be manufactured in the following procedure.

i) First, a conductive elastomer composition including an insulating material and magnetic conductive particles P is prepared. Then, a conductive elastomer composition layer is formed by applying the conductive elastomer composition on a mold-releasing support plate.

ii) Next, a magnetic field is applied in the thickness direction of the conductive elastomer composition layer, and thus conductive particles P dispersed in the conductive elastomer composition layer are aligned in the thickness direction. Then, while continuously applying the magnetic field to conductive elastomer composition layer, or after the application of the magnetic field is stopped, the conductive elastomer composition layer is cured to obtain a conductive elastomer layer in which conductive particles P are aligned in the thickness direction.

iii) Then, second anisotropic conductive sheet 50 composed of the conductive elastomer layer is obtained by peeling off the mold-releasing support plate.

As the mold-releasing support plate used in the step i), a metal plate, a ceramic plate, a resin plate and their combined materials and the like may be used. The application of the conductive elastomer composition can be performed by a printing method as screen printing, a roll application method, or a blade application method. The thickness of conductive elastomer composition layer is set in accordance with the length of the conduction path to be formed. The means for applying a magnetic field to conductive elastomer composition layer may be an electromagnet, a permanent magnet and the like.

Preferably, in the step of ii), the strength of the magnetic field applied to the conductive elastomer composition layer is 0.2 to 2.5 Tesla. Normally, the conductive elastomer composition layer is cured through a heat treatment. The specific heating temperature and heating time are appropriately set in consideration of the type of the elastomer composition that constitutes the conductive elastomer composition layer, the time required for the movement of conductive particles P and the like.

3. Other Notes

It is to be noted that while each anisotropic conductive sheet including the conduction path including non-linear part 11c is used in the above-mentioned embodiments, an anisotropic conductive sheet including a conduction path that does not include non-linear part 11c may be used in accordance with the purpose (see FIGS. 16 and 17).

Figure 16A:
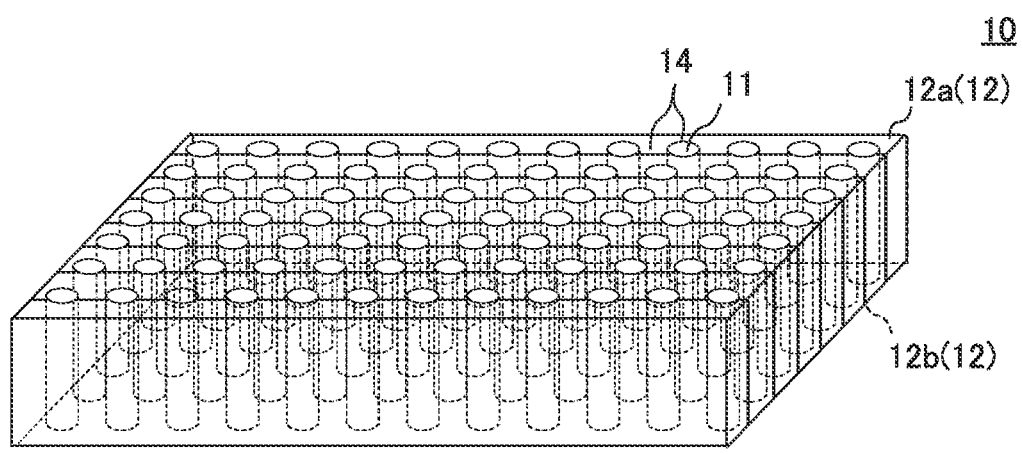
FIGS. 16A to 16C illustrate an anisotropic conductive sheet according to a modification.
Figure 16B:
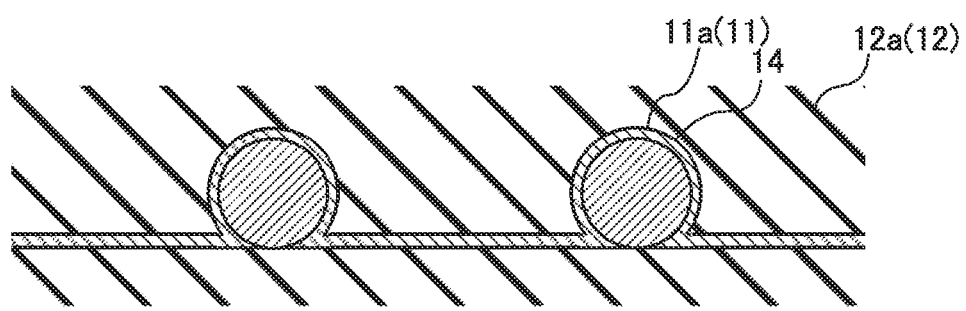
Figure 16C:
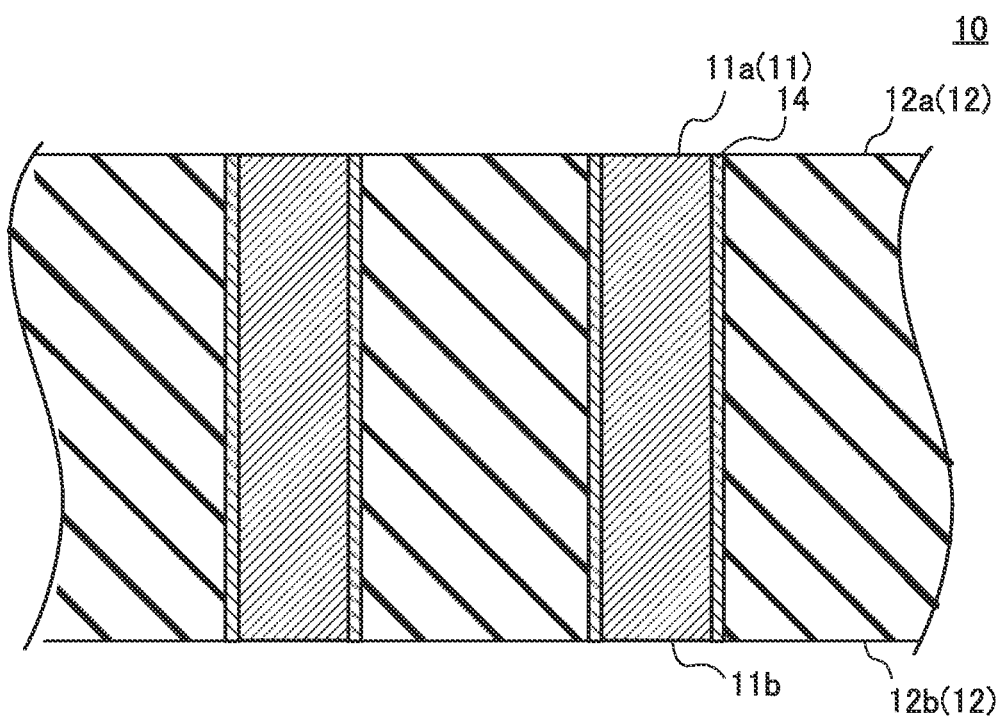

FIGS. 16A to 16C illustrate an anisotropic conductive sheet according to a modification. FIG. 16A is a perspective view, FIG. 16B is a partially enlarged view of a horizontal cross section, and FIG. 16C is a partially enlarged view of a vertical cross section.

For example, peeling between conduction path 11 and insulation layer 12 tends to occur at conduction path 11 that does not include non-linear part 11c, and therefore bonding layer 14 may be disposed between insulation layer 12 and conduction path 11 that does not include non-linear part 11c (see FIGS. 16A to 16C).

Figure 17A:
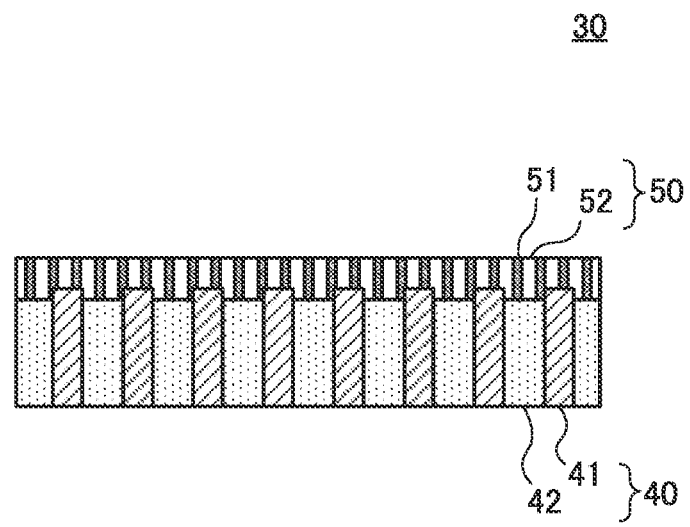
FIG. 17A is a sectional view illustrating an anisotropic conductive composite sheet according to a modification.
Figure 17B:
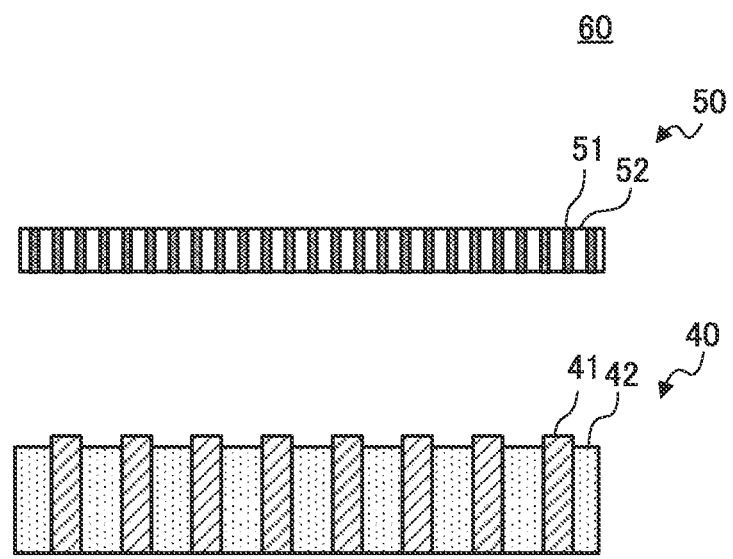
FIG. 17B is a sectional view illustrating an anisotropic conductive sheet set according to a modification.

FIG. 17A is a partially enlarged sectional view illustrating an anisotropic conductive composite sheet according to a modification, and FIG. 17B is a partially enlarged sectional view illustrating an anisotropic conductive sheet set according to a modification. For example, an anisotropic conductive sheet in which conduction path 11 does not include non-linear part 11c is less deflected in the thickness direction, and may damage the terminal of the inspection object, but may be used as an anisotropic conductive composite sheet and an anisotropic conductive sheet set (see FIGS. 17A and 17B).

In addition, while electrical testing is performed by pressing inspection object 130 to inspection substrate 120 where anisotropic conductive sheet 10 is disposed in the present embodiment, this is not limitative, and electrical testing may be performed by pressing inspection substrate 120 where anisotropic conductive sheet 10 is disposed to inspection object 130.

In addition, while the anisotropic conductive sheet is used for electrical testing in the present embodiment, this is not limitative, and it may be used for an electrical connection between two electronic members, such as an electrical connection between a glass substrate and a flexible printed board and an electrical connection between a substrate and an electronic component mounted on it.

This application is entitled to and claims the benefit of Japanese Patent Application No. 2018-218281 filed on Nov. 21, 2018, Japanese Patent Application No. 2019-54538 filed on Mar. 22, 2019, and Japanese Patent Application No. 2019-98814 filed on May 27, 2019 the disclosure each of which including the specification, drawings and abstract is incorporated herein by reference in its entirety.

INDUSTRIAL APPLICABILITY

According to the present disclosure, an anisotropic conductive sheet, an anisotropic conductive composite sheet, an anisotropic conductive sheet set, an electrical testing apparatus and an electrical testing method that can suppress damage of inspection objects can be provided.

REFERENCE SIGNS LIST

10 Anisotropic conductive sheet
11, 41, 51 Conduction path

11a First end portion
11b Second end portion
11c Non-linear part
12, 42, 52 Insulation layer
12a First surface
12b Second surface
13 Electrolyte layer
14, 24 Bonding layer
20 Composite sheet
21 Insulating sheet
22 Conduction line
23 Laminated body
30 Anisotropic conductive composite sheet
40 First anisotropic conductive sheet
41a Third end portion
41b Fourth end portion
42a Third surface
42b Fourth surface
50 Second anisotropic conductive sheet
51a Fifth end portion
51b Sixth end portion
52a Fifth surface
52b Sixth surface
60 Anisotropic conductive sheet set
100 Electrical testing apparatus
110 Holding container
120 Inspection substrate
121 Electrode
130 Inspection object
131 Terminal (of inspection object)

The invention claimed is:

1. An anisotropic conductive sheet comprising:
a plurality of conduction paths;
an insulation layer disposed to fill a gap between the plurality of conduction paths, the insulation layer including a first surface and a second surfacer; and
a plurality of bonding layers, each of the plurality of bonding layers being disposed in at least a part of a region between the plurality of conduction paths and the insulation layer;
wherein each of the plurality of conduction paths extends in a thickness direction of the insulation layer, and includes a first end portion on a first surface side and a second end portion on a second surface side,
wherein when each of the plurality of conduction paths is viewed through such that a center of the first end portion and a center of the second end portion overlap each other, at least a part of each of the plurality of conduction paths does not overlap the first end portion and the second end portion, and
wherein the bonding layer includes a polycondensation product of alkoxysilane or an oligomer thereof.

2. The anisotropic conductive sheet according to claim 1, wherein the first end portion is exposed to the first surface side; and
wherein the second end portion is exposed to the second surface side.

3. The anisotropic conductive sheet according to claim 1, wherein as viewed through along the thickness direction of the insulation layer in plan, the center of the first end portion and the center of the second end portion overlap each other, and at least a part of each of the plurality of conduction paths does not overlap the first end portion and the second end portion.

4. The anisotropic conductive sheet according to claim 1, wherein in a cross-section along the thickness direction of the insulation layer, at least a part of each of the plurality of conduction paths has a wavy shape, a zigzag shape, an arch shape, or a v shape.

5. The anisotropic conductive sheet according to claim 4, wherein in a cross-section along the thickness direction of the insulation layer, at least a part of each of the plurality of conduction paths located on the first end portion side than a midpoint between the first end portion and the second end portion has a wavy shape, a zigzag shape, an arch shape, or a v shape.

6. The anisotropic conductive sheet according to claim 1, wherein a center-to-center distance of the first end portions of the plurality of conduction paths is 5 to 55 μm.

7. The anisotropic conductive sheet according to claim 6, wherein a circle equivalent diameter of the first end portion of each of the plurality of conduction paths is 2 to 20 μm.

8. The anisotropic conductive sheet according to claim 1, wherein the insulation layer includes a first resin composition;
wherein the bonding layer includes a second resin composition; and
wherein a glass transition temperature of the second resin composition is higher than a glass transition temperature of the first resin composition.

9. The anisotropic conductive sheet according to claim 1, wherein the anisotropic conductive sheet is used for electrical testing of an inspection object; and
wherein the inspection object is disposed on the first surface.

10. An anisotropic conductive composite sheet comprising:
a first anisotropic conductive sheet including a plurality of first conduction paths extending through the first anisotropic conductive sheet in a thickness direction of the first anisotropic conductive sheet, and a first insulation layer disposed to fill a gap between the plurality of first conduction paths, the first insulation layer including a third surface and a fourth surface; and
a second anisotropic conductive sheet including a plurality of second conduction paths extended in a thickness direction of the second anisotropic conductive sheet, and a second insulation layer disposed to fill a gap between the plurality of second conduction paths, the second insulation layer including a fifth surface and a sixth surface;
wherein the first anisotropic conductive sheet and the second anisotropic conductive sheet are stacked such that the third surface of the first insulation layer and the sixth surface of the second insulation layer face each other,
wherein a center-to-center distance p2 of the plurality of second conduction paths on a fifth surface side is smaller than a center-to-center distance p1 of the plurality of first conduction paths on a third surface side,
wherein a rockwell hardness of the fifth surface of the second anisotropic conductive sheet is smaller than a rockwell hardness of the third surface of the first anisotropic conductive sheet, and
wherein at least one of the first anisotropic conductive sheet or the second anisotropic conductive sheet is an anisotropic conductive sheet,
wherein the anisotropic conductive sheet comprises:
a plurality of conduction paths; and
an insulation layer disposed to fill a gap between the plurality of conduction paths, the insulation layer including a first surface and a second surface,
wherein each of the plurality of conduction paths extends in a thickness direction of the insulation layer, and includes a first end portion on a first surface side of the insulation layer and a second end portion on a second surface side of the insulation layer, and wherein when each of the plurality of conduction paths is viewed through such that a center of the first end portion and a center of the second end portion overlap each other, at least a part of each of the plurality of conduction paths does not overlap the first end portion and the second end portion.

11. The anisotropic conductive composite sheet according to claim 10, wherein the rockwell hardness of the fifth surface of the second anisotropic conductive sheet is M120 or less.

12. The anisotropic conductive composite sheet according to claim 10, wherein the center-to-center distance p2 of the plurality of second conduction paths on the fifth surface side is 18 to 31% of the center-to-center distance p1 of the plurality of first conduction paths on the third surface side.

13. The anisotropic conductive composite sheet according to claim 10, wherein a thickness of the second insulation layer is smaller than a thickness of the first insulation layer.

14. The anisotropic conductive composite sheet according to claim 10,
wherein the anisotropic conductive composite sheet is used for electrical testing of an inspection object; and
wherein the inspection object is disposed on the fifth surface of the second anisotropic conductive sheet.

15. An anisotropic conductive sheet set comprising:
a first anisotropic conductive sheet including a plurality of first conduction paths extending through the first anisotropic conductive sheet in a thickness direction of the first anisotropic conductive sheet, and a first insulation layer disposed to fill a gap between the plurality of first conduction paths, the first insulation layer including a third surface and a fourth surface; and
a second anisotropic conductive sheet including a plurality of second conduction paths extended in a thickness direction of the second anisotropic conductive sheet, and a second insulation layer disposed to fill a gap between the plurality of second conduction paths, the second insulation layer including a fifth surface and a sixth surface;
wherein the first anisotropic conductive sheet and the second anisotropic conductive sheet are configured to be stacked such that the third surface of the first insulation layer and the sixth surface of the second insulation layer face each other,
wherein a center-to-center distance p2 of the plurality of second conduction paths on a fifth surface side is smaller than a center-to-center distance p1 of the plurality of first conduction paths on a third surface side, wherein a rockwell hardness of the fifth surface of the second anisotropic conductive sheet is smaller than a rockwell hardness of the third surface of the first anisotropic conductive sheet, and wherein at least one of the first anisotropic conductive sheet or the second anisotropic conductive sheet is an anisotropic conductive sheet, wherein the anisotropic conductive sheet comprises:
a plurality of conduction paths; and
an insulation layer disposed to fill a gap between the plurality of conduction paths, the insulation layer including a first surface and a second surface, wherein each of the plurality of conduction paths extends in a thickness direction of the insulation layer, and includes a first end portion on a first surface side of the insulation layer and a second end portion on a second surface side of the insulation layer, and wherein when each of the plurality of conduction paths is viewed through such that a center of the first end portion and a center of the second end portion overlap each other, at least a part of each of the plurality of conduction paths does not overlap the first end portion and the second end portion.

16. The anisotropic conductive sheet set according to claim 15,
wherein the anisotropic conductive sheet set is used for electrical testing of an inspection object; and
wherein the inspection object is disposed on the fifth surface of the second anisotropic conductive sheet.

17. An electrical testing apparatus comprising:
an inspection substrate including a plurality of electrodes; and
the anisotropic conductive sheet according to claim 1, the anisotropic conductive sheet being disposed on a surface of the inspection substrate on which the plurality of electrodes is disposed.

18. An electrical testing method comprising:
stacking an inspection substrate including a plurality of electrodes and an inspection object including a terminal through the anisotropic conductive sheet according to claim 1, and electrically connecting the plurality of electrodes of the inspection substrate and the terminal of the inspection object through the anisotropic conductive sheet.

* * * * *